US010869395B2

(12) United States Patent
Katayama et al.

(10) Patent No.: US 10,869,395 B2
(45) Date of Patent: Dec. 15, 2020

(54) FLEXIBLE SUBSTRATE, FLEXIBLE SUBSTRATE-ATTACHED COMPONENT, AND MANUFACTURING METHOD OF FLEXIBLE SUBSTRATE-ATTACHED COMPONENT

(71) Applicant: FURUKAWA ELECTRIC CO., LTD., Tokyo (JP)

(72) Inventors: Etsuji Katayama, Tokyo (JP); Jun Miyokawa, Tokyo (JP); Maiko Ariga, Tokyo (JP); Toshio Sugaya, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 15/669,126

(22) Filed: Aug. 4, 2017

(65) Prior Publication Data

US 2017/0339793 A1 Nov. 23, 2017

Related U.S. Application Data

(63) Continuation of application No. PCT/JP2016/000690, filed on Feb. 10, 2016.

(30) Foreign Application Priority Data

Feb. 12, 2015 (JP) .................. 2015-025827

(51) Int. Cl.
*H05K 1/18* (2006.01)
*H05K 3/32* (2006.01)
(Continued)

(52) U.S. Cl.
CPC ............. *H05K 1/189* (2013.01); *H05K 1/028* (2013.01); *H05K 1/11* (2013.01); *H05K 1/117* (2013.01);
(Continued)

(58) Field of Classification Search
CPC .......... H05K 1/189; H05K 1/147; H05K 3/40; H05K 1/028; H05K 3/32; H05K 1/181; H05K 1/11
(Continued)

(56) References Cited

U.S. PATENT DOCUMENTS

2008/0249363 A1* 10/2008 Nakamura ........... A61B 1/0011
600/132
2008/0253720 A1 10/2008 Yamaguchi et al.
2009/0249363 A1 10/2009 Dobyns et al.

FOREIGN PATENT DOCUMENTS

JP 10-41594 2/1998
JP 11345987 A * 12/1999 ........... G02B 6/4201
(Continued)

OTHER PUBLICATIONS

International Search Report dated May 10, 2016 in PCT/JP2016/000690, filed on Feb. 10, 2016 (with English Translation).
(Continued)

*Primary Examiner* — Arun Ramaswamy
(74) *Attorney, Agent, or Firm* — Oblon, McClelland, Maier & Neustadt, L.L.P.

(57) ABSTRACT

A flexible substrate has an insulating base member and a conductive layer that is formed on the base member and includes an electrical connecting portion fixed to a component and electrically connected to the component, and the flexible substrate includes: a main portion on which the electrical connecting portion is formed; and a protruding portion provided so as to protrude from a portion of the main portion in which the electrical connecting portion is formed, wherein the main portion is bent along a first bending line extending in a first direction, and wherein the protruding portion can be bent along a second bending line extending in a second direction intersecting the first direction and is
(Continued)

adapted to reduce stress occurring at the electrical connecting portion by the protruding portion being bent along the second bending line.

13 Claims, 12 Drawing Sheets

(51) Int. Cl.
| | |
|---|---|
| *H05K 1/02* | (2006.01) |
| *H05K 1/11* | (2006.01) |
| *H05K 3/36* | (2006.01) |
| *H05K 3/40* | (2006.01) |
| *H05K 3/34* | (2006.01) |

(52) U.S. Cl.
CPC ............... *H05K 1/181* (2013.01); *H05K 3/32* (2013.01); *H05K 3/366* (2013.01); *H05K 3/40* (2013.01); *H05K 1/0271* (2013.01); *H05K 3/3447* (2013.01); *H05K 3/363* (2013.01); *H05K 3/4015* (2013.01); *H05K 2201/053* (2013.01); *H05K 2201/09618* (2013.01); *H05K 2201/10121* (2013.01); *H05K 2201/10303* (2013.01)

(58) Field of Classification Search
USPC ........ 174/254, 75 R, 262; 439/331; 361/748, 361/761
See application file for complete search history.

(56) References Cited

FOREIGN PATENT DOCUMENTS

| | | |
|---|---|---|
| JP | 2005-56952 | 3/2005 |
| JP | 2005-292389 | 10/2005 |
| JP | 2006-332455 | 12/2006 |
| JP | 2007-281012 | 10/2007 |
| JP | 2008-91797 | 4/2008 |
| JP | 2008-263122 | 10/2008 |
| JP | 2011-155199 | 8/2011 |

OTHER PUBLICATIONS

Written Opinion dated May 10, 2016 in PCT/JP2016/000690, filed on Feb. 10, 2016.
Combined Office Action and Search Report dated May 28, 2019 in Chinese Patent Application No. 201680010235.6 (with English translation of the Office Action and English translation of category of cited documents) citing document AA therein, 20 pages.

* cited by examiner

FLEXIBLE SUBSTRATE, FLEXIBLE SUBSTRATE-ATTACHED COMPONENT, AND MANUFACTURING METHOD OF FLEXIBLE SUBSTRATE-ATTACHED COMPONENT

CROSS-REFERENCES TO RELATED APPLICATIONS

This application is a continuation application of International Application No. PCT/JP2016/000690, filed Feb. 10, 2016, which claims the benefit of Japanese Patent Application No. 2015-025827, filed Feb. 12, 2015. The contents of the aforementioned applications are incorporated herein by reference in their entireties.

FIELD

The present invention relates to a flexible substrate, a flexible substrate-attached component on which the flexible substrate is mounted, and a manufacturing method of the flexible substrate-attached component.

BACKGROUND

Flexible substrates called flexible printed circuits (FPC) are widely used for configuring electric circuits in electronic devices. In a flexible substrate, wirings of a conductive layer such as a copper foil are formed on a flexible sheet-like base member such as a polyimide film material. The flexible substrate has a small thickness and can be deformed such as bent, warped, or the like. Thus, such a flexible substrate makes it possible to arrange a wiring in a space within an electronic device, arrange a wiring in a moving part, and arrange a wiring in a three-dimensional manner.

A flexible substrate has an electrical connecting portion fixed to a component and electrically connected to a wiring of the component. When the flexible substrate is bent or warped, concentration of stress may occur at the electrical connecting portion of the flexible substrate. Concentration of stress may cause a problem of open circuit of a wire.

In order to prevent the problem due to the stress described above, various technologies have been proposed so far (see Japanese Patent Application Publication No. 2007-281012, Japanese Patent Application Publication No. 2008-263122, and the like).

Japanese Patent Application Publication No. 2007-281012 discloses a configuration in which a fixing portion which does not form an electrical path between components is provided between an electrical connecting portion and a folding portion in a flexible substrate. In the configuration disclosed in Japanese Patent Application Publication No. 2007-281012, the fixing portion is a hole similar to the electrical connecting portion, and a protruding part for fixing a component is inserted therein and fixed by soldering. In this configuration, since stress is applied to a connecting portion between the fixing portion and the protruding part rather than a connecting portion between the electrical connecting portion and the terminal, open circuit of the electrical path is expected to be prevented.

Further, Japanese Patent Application Publication No. 2008-263122 discloses a configuration in which through holes for connection and fixing that are protected by a coverlay are formed in a flexible substrate, and an adhesive material (adhesive agent) such as a resin is injected in the through holes for connection and fixing to adhere and fix the flexible substrate and an optical module to each other. In this configuration, the flexible substrate is folded at a folding position with stress being concentrated at the folding position near the circumference of the through hole used for adhesion and fixing, and open circuit of the electrical path is expected to be prevented because an electrical signal path is protected by the coverlay at this folding position.

In the methods of Japanese Patent Application Publication No. 2007-281012 and Japanese Patent Application Publication No. 2008-263122, however, while stress may be reduced in an electrical connecting portion of a flexible substrate, there still remains a problem that stress is concentrated near a fixing portion or a through hole used for connection and fixing and a crack nearby may occur and then extend in the flexible substrate, resulting in open circuit of a wire of the flexible substrate. Further, it is necessary to provide a metal pin or the like that is similar to the electrical connecting portion as a fixing portion, which results in a problem of a complex structure.

SUMMARY

The present invention has been made in view of the above and intends to provide a flexible substrate, a flexible substrate-attached component, and a manufacturing method of the flexible substrate-attached component with a simple configuration which can reduce stress occurring at an electrical connecting portion.

According to an aspect of the present invention, provided is a flexible substrate having an insulating base member and a conductive layer that is formed on the base member and includes an electrical connecting portion fixed to a component and electrically connected to the component, the flexible substrate having: a main portion on which the electrical connecting portion is formed; and a protruding portion provided so as to protrude from a portion of the main portion in which the electrical connecting portion is formed, wherein the main portion is bent along a first bending line extending in a first direction, and wherein the protruding portion can be bent along a second bending line extending in a second direction intersecting the first direction and is adapted to reduce stress occurring at the electrical connecting portion by the protruding portion being bent along the second bending line.

According to another aspect of the present invention, provided is a flexible substrate-attached component having: a component; and a flexible substrate having an insulating base member and a conductive layer that is formed on the base member and includes an electrical connecting portion fixed to a component and electrically connected to the component, the flexible substrate having a main portion on which the electrical connecting portion is formed, and a protruding portion provided so as to protrude from a portion of the main portion in which the electrical connecting portion is formed, wherein the main portion is bent along a first bending line extending in a first direction, and wherein the protruding portion is bent along a second bending line extending in a second direction intersecting the first direction and is adapted to reduce stress occurring at the electrical connecting portion by the protruding portion being bent along the second bending line.

According to yet another aspect of the present invention, provided is a manufacturing method of a flexible substrate-attached component, the manufacturing method having: preparing a flexible substrate having an insulating base member and a conductive layer that is formed on the base member and includes an electrical connecting portion fixed to a component and electrically connected to the component, the flexible substrate having a main portion on which the electrical connecting portion is formed, and a protruding portion provided so as to protrude from a portion of the main portion in which the electrical connecting portion is formed, wherein the main portion is bent along a first bending line extending in a first direction, and wherein the protruding portion is bent along a second bending line extending in a second direction intersecting the first direction and is adapted to reduce stress occurring at the electrical connecting portion by the protruding portion being bent along the second bending line; and fixing the electrical connecting portion of the flexible substrate to the component and attaching the flexible substrate to the component.

According to the present invention, stress occurring at an electrical connecting portion can be reduced with a simple configuration.

DESCRIPTION OF EMBODIMENTS

First Embodiment

A flexible substrate, a flexible substrate-attached component, and a manufacturing method of the flexible substrate-attached component according to the first embodiment of the present invention will be described by using FIG. 1 to FIG. 4C.

Figure 1A:
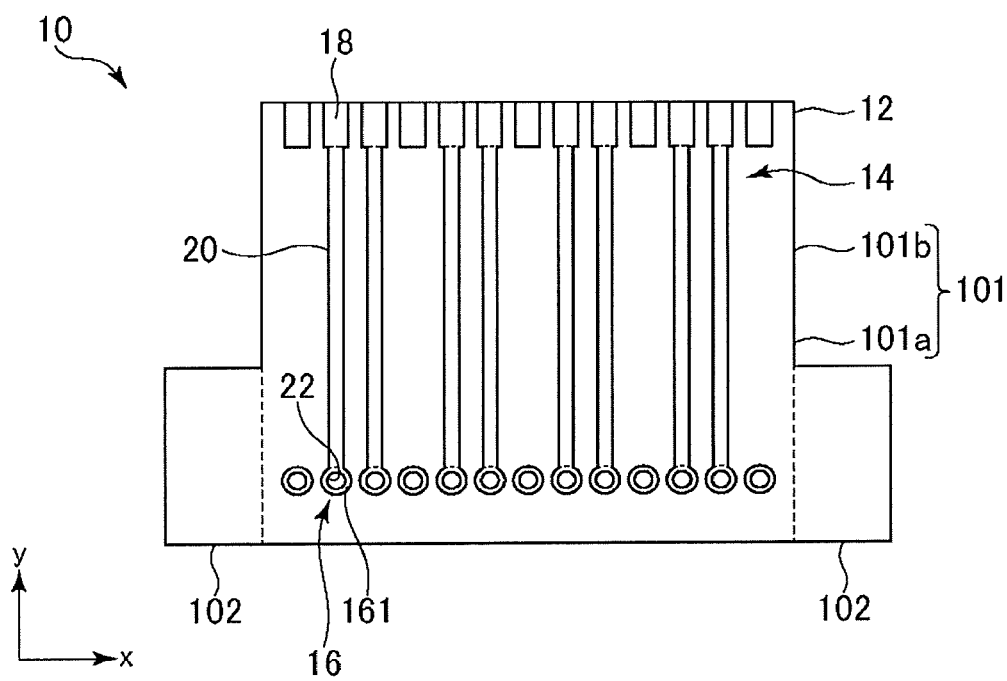
FIG. 1A is a schematic view (part 1) illustrating a flexible substrate according to a first embodiment of the present invention.
Figure 1B:
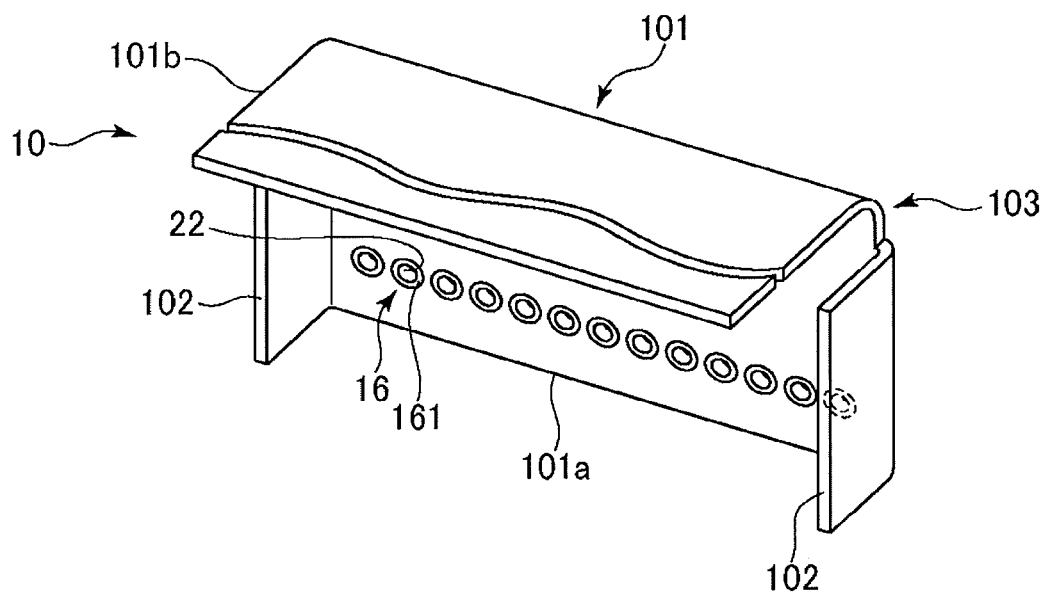
FIG. 1B is a schematic view (part 2) illustrating the flexible substrate according to the first embodiment of the present invention.

First, a configuration of the flexible substrate according to the present embodiment will be described by using FIG. 1A and FIG. 1B. FIG. 1A is a plan view illustrating an unbent flexible substrate according to the present embodiment. FIG. 1B is a perspective view illustrating a bent flexible substrate according to the present embodiment.

As illustrated in FIG. 1A, a flexible substrate 10 according to the present embodiment has a flexible sheet-like base member 12 and a wiring pattern 14 formed on the sheet-like base member 12.

The sheet-like base member 12 is an insulating base member made of a film material such as a polyimide film material, for example. The sheet-like base member 12 has flexibility and softness. Therefore, the flexible substrate 10 can be deformed such as bent, warped, or the like.

The flexible substrate 10 has a main portion 101 in which the wiring pattern 14 is formed and a protruding portions 102 protruding from the main portion 101.

The main portion 101 has substantially a rectangular planar shape. The main portion 101 is adapted to be bent along a first bending line extending in a first direction, which is the extending direction of a pair of sides, as illustrated in FIG. 1B, when being mounted on an optical component as described later. Note that, in the present specification, bending along a bending line extending in a predetermined direction may be referred to as "bending along a predetermined direction". Further, when simply referring to "bend", the term "bend" can include not only the meaning of "bend" that means being bent but also the meaning of "warp" that means being warped. The main portion 101 has a first portion 101*a* on one side and a second portion 101*b* on the other side with respect to a bending portion 103 as a boundary when being bent in such a way.

Note that the main portion 101 is not limited to those having substantially a rectangular planar shape and may be those having various planar shapes. Further, while the main portion 101 is bent along the first bending line, the first direction is not necessarily required to be the extending direction of a pair of sides and may be any direction selected in accordance with the arrangement of the flexible substrate 10 in use.

Two protruding portions 102 are provided to the first portion 101*a* of the main portion 101 so as to protrude respectively from the other pair of sides extending in a second direction that is orthogonal to the above-described first direction. FIG. 1A and FIG. 5, FIG. 7, and FIG. 9 regarding other embodiments described later illustrate the first direction as an x-direction and the second direction as a y-direction. Note that the protruding portions 102 are not necessarily required to be provided on both sides of the other pair of sides of the first portion 101*a*, and at least one protruding portion 102 may be provided to one of the other pair of sides. With being provided on both sides, however, the protruding portions 102 can further ensure to reduce the concentration of stress.

Each protruding portion 102 has substantially a rectangular planar shape. Further, each protruding portion 102 can be bent from the base on the first portion 101*a* side along the above-described second direction. That is, each protruding portion 102 can be bent along a second bending line extending in the second direction orthogonal to the first direction. FIG. 1A illustrates the second bending lines with dashed lines. Note that each protruding portion 102 is not necessarily required to be bendable along the second bending line extending in the direction orthogonal to the first direction, and may be bendable along the second bending line extending in a direction intersecting the first direction. Further, the protruding portion 102 is not limited to those having substantially a rectangular planar shape and may be those having various planar shapes.

The wiring pattern 14 is formed on one of the primary surfaces of the sheet-like base member 12 of the main portion 101. Note that the wiring pattern 14 is not formed on the protruding portion 102 of the sheet-like base member 12. The wiring pattern 14 has a plurality of first electrical connecting portions 16, a plurality of second electrical connecting portions 18, and a plurality of wirings 20 that connect the first electrical connecting portions 16 to the second electrical connecting portions 18, for example. The wiring pattern 14 is formed of a conductive layer of a conductive foil or the like such as a copper foil, for example. Note that, in the main portion 101, a predetermined wiring pattern may be formed not only on one primary surface but also on the other primary surface of the sheet-like base member 12.

The plurality of first electrical connecting portions 16 are formed aligned in a line in the first direction on the first portion 101*a* of the main portion 101. A plurality of through holes 22 are formed correspondingly to the plurality of first electrical connecting portions 16 in the first portion 101*a* where the plurality of first electrical connecting portions 16 are formed. Each through hole 22 is formed so as to penetrate the first portion 101*a* from one primary surface to the other primary surface. The plurality of through holes 22 are formed aligned in the first direction. Each of the plurality of first electrical connecting portions 16 has a land portion 161 formed around the opening of the corresponding through hole 22. While not limited to those having a particular planar shape, the land portion 161 has substantially a circular annular planar shape, for example.

Note that the plurality of first electrical connecting portions 16 are not limited to those formed aligned in a line in the first direction and can be formed in various forms. For example, the plurality of first electrical connecting portions 16 may be formed in a line in another direction, or may be formed aligned in a plurality of lines in the first direction or another direction.

The protruding portions 102 of the flexible substrate 10 are formed to be located on the sides of the plurality of first electrical connecting portions 16 formed aligned in the first direction as described above. That is, in the main portion 101, the plurality of first electrical connecting portions 16 are located within the width in the second direction of the protruding portions 102. In other words, in the main portion 101, the plurality of first electrical connecting portions 16 are located within the width of the second bending line. For example, the plurality of first electrical connecting portions 16 are located, within the width in the second direction of the protruding portions 102, at the center in the second direction of the protruding portions 102 or on the side, with respect to the center, away from a portion to become the bending portion 103 bent along the first direction of the main portion 101. In other words, the plurality of first electrical connecting portions 16 are located, within the width of the second bending line, at the center of the second bending line or on the side away from the first bending line with respect to the center.

The plurality of second electrical connecting portions are formed aligned in the first direction on an edge running in the first direction in the second portion 101*b* of the main portion 101. Each of the plurality of second electrical connecting portions 18 is connectable to an external electrical terminal by using a socket or the like, for example.

The plurality of wirings 20 extending in the second direction are formed between the plurality of first electrical connecting portions 16 and the plurality of second electrical connecting portions 18. Each wiring 20 is formed so as to connect a particular land portion 161 of the first electrical connecting portion 16 to the corresponding second electrical connecting portion 18. Each land portion 161 of the first electrical connecting portion 16, the corresponding second electrical connecting portion 18, and the wiring 20 connected therebetween are formed of a conductive layer in an integral manner.

Note that the wiring pattern 14 can have various electrical connecting portions or wirings other than the first electrical connecting portions 16, the second electrical connecting portions 18, and the wirings 20 described above.

A coverlay (not depicted) made of a resin film or the like is formed on the sheet-like base member 12 on which the wiring pattern 14 is formed. Note that no coverlay is formed on a region of the sheet-like base member 12 where the first electrical connecting portions 16 and the second electrical connecting portions 18 are formed, and thus the first electrical connecting portions 16 and the second electrical connecting portions 18 are exposed.

The flexible substrate 10 according to the present embodiment configured as described above can be mounted on an optical component with the main portion 101 and the protruding portions 102 being bent, for example. FIG. 1B illustrates the flexible substrate 10 in a state where the main portion 101 and the protruding portions 102 are bent.

As illustrated in FIG. 1B, the main portion 101 is bent along the first direction such that the angle between the first portion 101a and the second portion 101b via the bending portion 103 is around 90 degrees, for example. Note that the angle between the first portion 101a and the second portion 101b when the main portion 101 is bent is not limited to around 90 degrees, and may be set to any angle.

Further, each protruding portion 102 is bent from the base thereof along the second direction such that the angle of the protruding portion 102 relative to the first portion 101a is around 90 degrees, for example. Note that the angle of the protruding portion 102 relative to the first portion 101a when the protruding portion 102 is bent is not limited to around 90 degrees, and may be set to any angle.

Further, while FIG. 1B illustrates the case where each protruding portions 102 are bent to the same side of the second portion 101b of the main portion 101, the protruding portions 102 may be bent to the opposite side of the second portion 101b.

One of the features of the flexible substrate 10 according to the present embodiment is that the flexible substrate 10 has the protruding portions 102 that can be bent along the second direction, which intersects the first direction, with respect to the main portion 101 bent along the first direction.

When a flexible substrate is attached to a component via the electrical connecting portion by using solder or the like, the flexible substrate may be bent or warped during the attaching process. Further, also during inspection performed by connecting a terminal to the flexible substrate attached to a component, the flexible substrate may be bent or warped. When the flexible substrate is bent or warped, concentration of stress occurs at the electrical connecting portion that is fixed by a fixing member such as solder and becomes a fulcrum. More specifically, concentration of stress occurs at the boundary between the sheet-like base member and the fixing member at the electrical connecting portion in the flexible substrate. Such stress may cause a crack of the flexible substrate and can be one of the reasons for occurrence of open circuit in a wiring formed in the flexible substrate.

In contrast, in the flexible substrate 10 according to the present embodiment, the protruding portion 102 is bent from the base thereof along the second direction when the flexible substrate 10 is mounted on a component. Thus, the rigidity of the boundary portion between the protruding portion 102 and the first portion 101a increases against bending or warping of the main portion 101 along a direction intersecting the second direction, such as bending along the first direction of the main portion 101. This can reduce concentration of stress occurring at the first electrical connecting portions 16 due to bending or warping of the main portion 101. Therefore, according to the flexible substrate 10 of the present embodiment, when the flexible substrate 10 is mounted on a component, occurrence of open circuit of the wirings 20 or other wirings formed in the flexible substrate 10 can be reduced or prevented.

Note that, while it is sufficient for the plurality of first electrical connecting portions 16 to be located within the width of the second bending line in the main portion 101, it is preferable for the plurality of first electrical connecting portions 16 to be separated as much as possible from the first bending line that defines a portion to become the bending portion 103 of the main portion 101. That is, it is preferable for the plurality of first electrical connecting portions 16 to be located at the center of the second bending line or on the side separated from the first bending line with respect to the center of the second bending line within the width of the second bending line. In such a way, since the plurality of first electrical connecting portions 16 are separated from a portion to become the bending portion 103 of the main portion 101, the stress occurring at the plurality of first electrical connecting portions 16 can be further reduced.

Figure 2A:
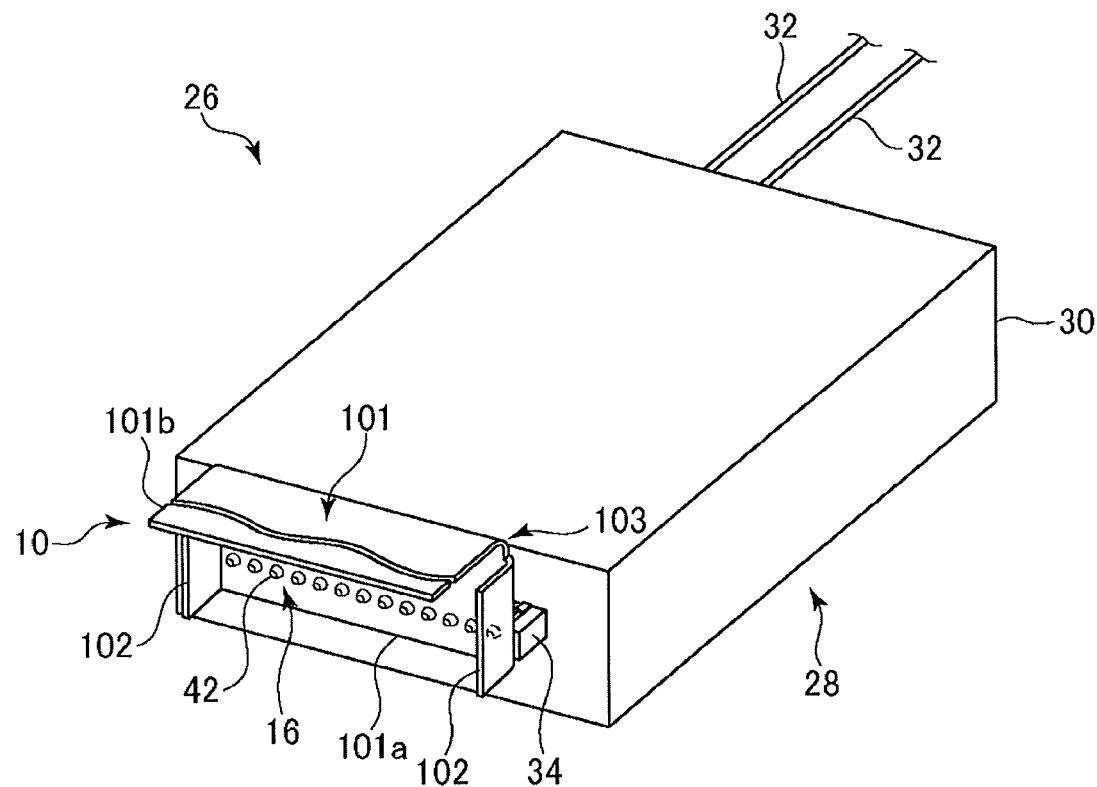
FIG. 2A is a schematic view (part 1) illustrating a flexible substrate-attached component according to the first embodiment of the present invention.
Figure 2B:
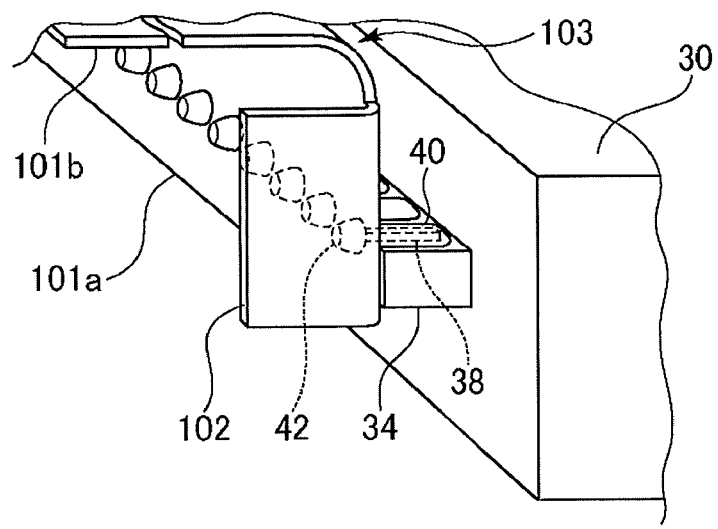
FIG. 2B is a schematic view (part 2) illustrating the flexible substrate-attached component according to the first embodiment of the present invention.
Figure 3:
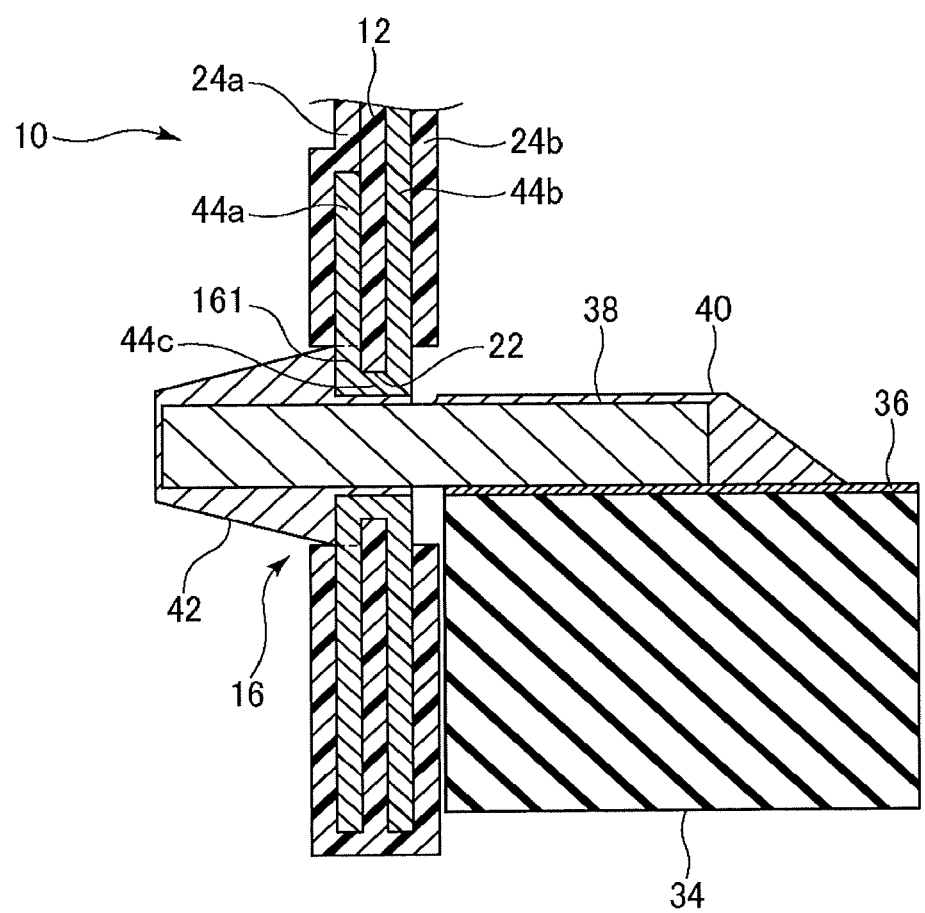
FIG. 3 is an enlarged sectional view illustrating an electrical connecting portion of the flexible substrate and the peripheral thereof in the flexible substrate-attached component according to the first embodiment of the present invention.

Next, a flexible substrate-attached component on which the flexible substrate 10 according to the above-described present embodiment is mounted will be further described by using FIG. 2A to FIG. 3. FIG. 2A is a perspective view illustrating the flexible substrate-attached component according to the present embodiment. FIG. 2B is a partially enlarged perspective view illustrating the flexible substrate and an optical component in the flexible substrate-attached component according to the present embodiment. FIG. 3 is a partially enlarged sectional view illustrating the first electrical connecting portion of the flexible substrate and the peripheral thereof in the flexible substrate-attached component according to the present embodiment.

As illustrated in FIG. 2A and FIG. 2B, a flexible substrate-attached component 26 according to the present embodiment has the above-described flexible substrate 10 and an optical component 28 to which the flexible substrate 10 is attached.

The optical component 28 has a casing 30 having substantially a rectangular parallelepiped external shape, for example. An optical semiconductor device (not depicted) such as a semiconductor laser, a photodiode, or the like is accommodated inside the casing 30, for example. Optical fibers 32 are connected to the optical component 28. The optical fibers 32 are provided to output an optical signal output from the optical semiconductor device inside the casing 30 and input an optical signal to be input to the optical semiconductor device inside the casing 30.

Further, an attachment unit 34 to which the flexible substrate 10 is attached is provided on a sidewall of the casing 30, as illustrated in FIG. 2A to FIG. 3. The attachment unit 34 is made of an insulating material such as a ceramic or the like, for example. On the upper surface of the attachment unit 34, a plurality of wirings 36 are formed aligned correspondingly to the plurality of first electrical connecting portions 16 of the flexible substrate 10. Each wiring 36 is a metalized wiring made of a metal film of a high melting metal material, for example. Each wiring 36 is electrically connected to an electrode or the like of an optical semiconductor device inside the casing 30.

A lead pin 38 that is an electrical terminal is fixed on each wiring 36 so as to protrude from the attachment unit 34 outward on the side to which the flexible substrate 10 is attached. The lead pin 38 is fixed on the wiring 36 by the conductive fixing member 40. Solder, a brazing filler metal, a conductive adhesion agent, or the like may be used for the fixing member 40, for example.

The flexible substrate 10 is arranged such that the first portion 101a of the main portion 101 is parallel to the sidewall of the casing 30 on which the attachment unit 34 is provided. Respective lead pins 38 are inserted in the plurality of corresponding through holes 22 of the flexible substrate 10. The lead pin 38 inserted in the through hole is fixed and electrically connected to the land portion 161 of the first electrical connecting portion 16 by a conductive fixing member 42. Solder, a brazing filler metal, a conductive adhesion agent, or the like may be used for the fixing member 42, for example.

Note that FIG. 3 illustrates an example of the sectional structure of the flexible substrate 10. As depicted, a conductive layer 44a forming the wiring pattern 14 including the land portion 161 is formed on one primary surface of the sheet-like base member 12 of the flexible substrate 10, and a conductive layer 44b forming another wiring pattern is formed on the other primary surface. Further, a conductive layer 44c that electrically connects the conductive layer 44a on one primary surface to the conductive layer 44b on the other primary surface is formed on the inner wall of the through hole 22. Coverlays 24a and 24b each made of a resin film or the like are formed on one primary surface and the other primary surface of the sheet-like base member 12 on which the conductive layers 44a and 44b are formed, respectively.

Note that the flexible substrate 10 may be a double-sided flexible substrate in which conductive layers are formed on both primary surfaces of the sheet-like base member 12 as described above, or may be a single-sided flexible substrate in which a conductive layer is formed on one of the primary surfaces of the sheet-like base member 12. Further, the flexible substrate 10 may be a multilayer flexible substrate in which a plurality of conductive layers including three or more conductive layers are laminated.

As discussed above, the flexible substrate 10 is attached to the optical component 28 via the plurality of first electrical connecting portions 16. In the flexible substrate 10 attached to the optical component 28, the main portion 101 is bent along the first direction, and the protruding portions 102 are bent along the second direction, as described above. The second portion 101b and the protruding portions 102 of the main portion 101 are bent toward the opposite side of the optical component 28, respectively.

In the flexible substrate-attached component 26 according to the present embodiment, the protruding portions 102 of the flexible substrate 10 are bent for bending or warping of the main portion 101 in the flexible substrate 10. This can reduce stress occurring at the first electrical connecting portions 16 due to bending or warping of the main portion 101. Therefore, in the flexible substrate-attached component 26 according to the present embodiment, occurrence of open circuit of the wiring 20 or other wirings formed in the flexible substrate 10 can be reduced or prevented.

Further, when there is a sufficient space around the first electrical connecting portions 16 (for example, on both sides of the first direction), concentration of stress at the first electrical connecting portions 16 can be reduced by providing one or more reinforcement plates in the space. For example, one or more reinforcement plates can be provided on both sides in the first direction of the plurality of first electrical connecting portions 16 aligned in the first direction, or one or more reinforcement plates can be provided so as to surround the circumference of the plurality of first electrical connecting portions 16. In recent years, however, reduction in size of flexible substrate-attached components is desired and, in many cases, there is no sufficient space for providing a reinforcement plate. Even when the space around the first electrical connecting portions 16 is narrow (for example, the distance from the first electrical connecting portions 16 to the edge of the flexible substrate 10 is several millimeters or less), the flexible substrate-attached component 26 of the present embodiment can reduce concentration of stress at the first electrical connecting portions 16.

Further, since concentration of stress can be suppressed by only providing the protruding portions 102 in the flexible substrate 10, a flexible substrate can be attached to a component at a low cost and a high design-flexibility.

Furthermore, since no adhesive agent or the like is applied near the wirings other than the first electrical connecting portions 16, even when a radio frequency (RF) signal (high frequency signal) is transmitted on the wiring of the flexible substrate, the RF characteristics (high frequency characteristics) of the flexible substrate is not deteriorated by an adhesive agent.

Figure 4A:
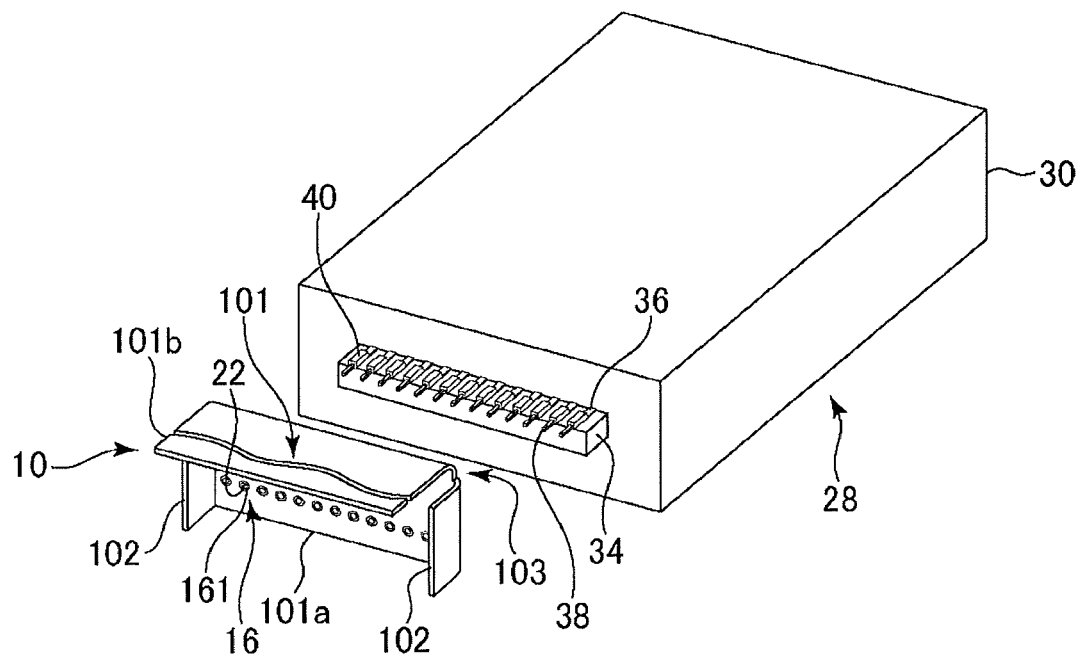
FIG. 4A is a perspective view (part 1) illustrating a manufacturing method of the flexible substrate-attached component according to the first embodiment of the present invention.
Figure 4B:
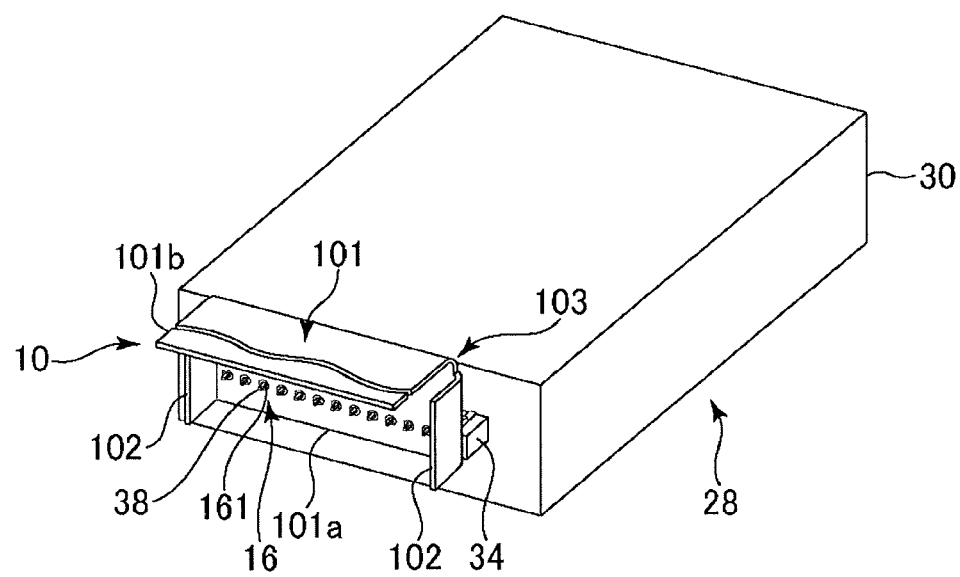
FIG. 4B is a perspective view (part 2) illustrating the manufacturing method of the flexible substrate-attached component according to the first embodiment of the present invention.
Figure 4C:
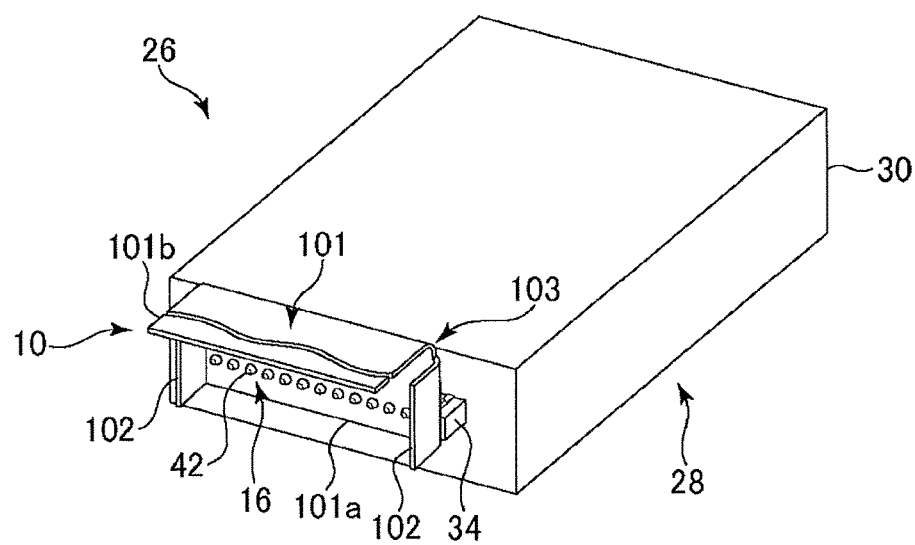
FIG. 4C is a perspective view (part 3) illustrating the manufacturing method of the flexible substrate-attached component according to the first embodiment of the present invention.

Next, a manufacturing method of a flexible substrate-attached component according to the present embodiment in which the flexible substrate 10 is mounted on the optical component 28 will be further described by using FIG. 4A to FIG. 4C. FIG. 4A to FIG. 4C are perspective views illustrating a manufacturing method of the flexible substrate-attached component according to the present embodiment.

First, as illustrated in FIG. 4A, in the flexible substrate 10 to be mounted on the optical component 28, the main portion 101 is bent along the first direction and the protruding portions 102 are bent from the base thereof along the second direction orthogonal to the first direction. In such a way, the flexible substrate 10 in which the main portion 101 and the protruding portions 102 are bent is prepared. On the other hand, the optical component 28 on which the flexible substrate 10 is mounted may be the optical component 28 obtained before the optical fibers 32 are connected or may be the optical component 28 obtained after the optical fibers 32 have been connected.

Next, as illustrated in FIG. 4B, the plurality of lead pins 38 provided to the attachment unit 34 of the optical component 28 are inserted in the corresponding through holes of the flexible substrate 10, respectively. Note that the flexible substrate 10 may be temporally attached to the optical component 28 with the lead pins 38 being inserted in the through holes 22.

Next, as illustrated in FIG. 4C, the lead pins 38 inserted in respective through holes 22 are fixed to the land portions 161 of the first electrical connecting portions 16 by using the conductive fixing member 42 such as solder, a brazing filler metal, a conductive adhesive agent, or the like. Thereby, the land portions 161 and the corresponding lead pins 38 are electrically connected.

As discussed above, the flexible substrate 10 is attached to the optical component 28 via the plurality of first electrical connecting portions 16, and thus the flexible substrate-attached component 26 is manufactured. Then, the optical fibers 32 are connected to the flexible substrate-attached component 26 if necessary.

Note that, in the above description, the case where the main portion 101 and the protruding portions 102 are bent before the flexible substrate 10 is attached to the optical component 28 has been described. However, at least one of the main portion 101 and the protruding portions 102 may be bent after the flexible substrate 10 is attached to the optical component 28. Note that, with the flexible substrate 10 being attached to the optical component 28 after bending the main portion 101 or the protruding portions 102, stress occurring due to bending of the main portion 101 or the protruding portions 102 can be prevented from being applied to the first electrical connecting portions 16. It is therefore preferable to bend the main portion 101 and the protruding portions 102 before attaching the flexible substrate 10 to the optical component 28.

Further, the protruding portions 102 may be cut after the second electrical connecting portions 18 of the flexible substrate 10 are connected to the external electrical terminals.

Second Embodiment

Figure 5:
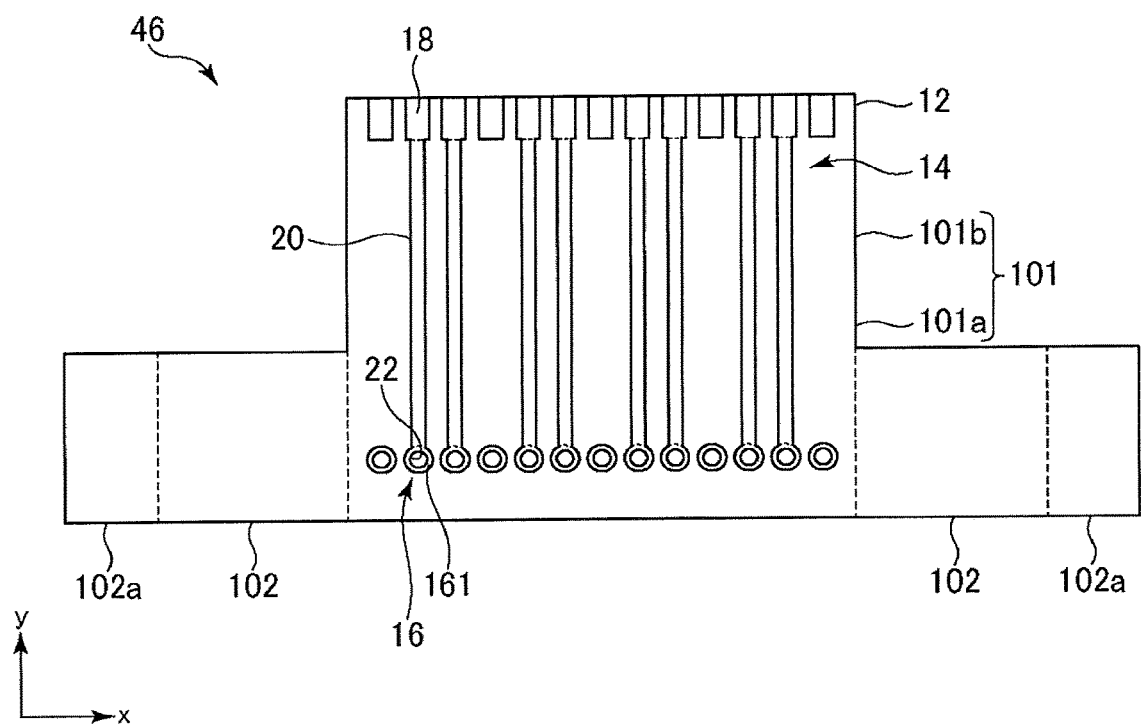
FIG. 5 is a plan view illustrating a flexible substrate according to a second embodiment of the present invention.
Figure 6:
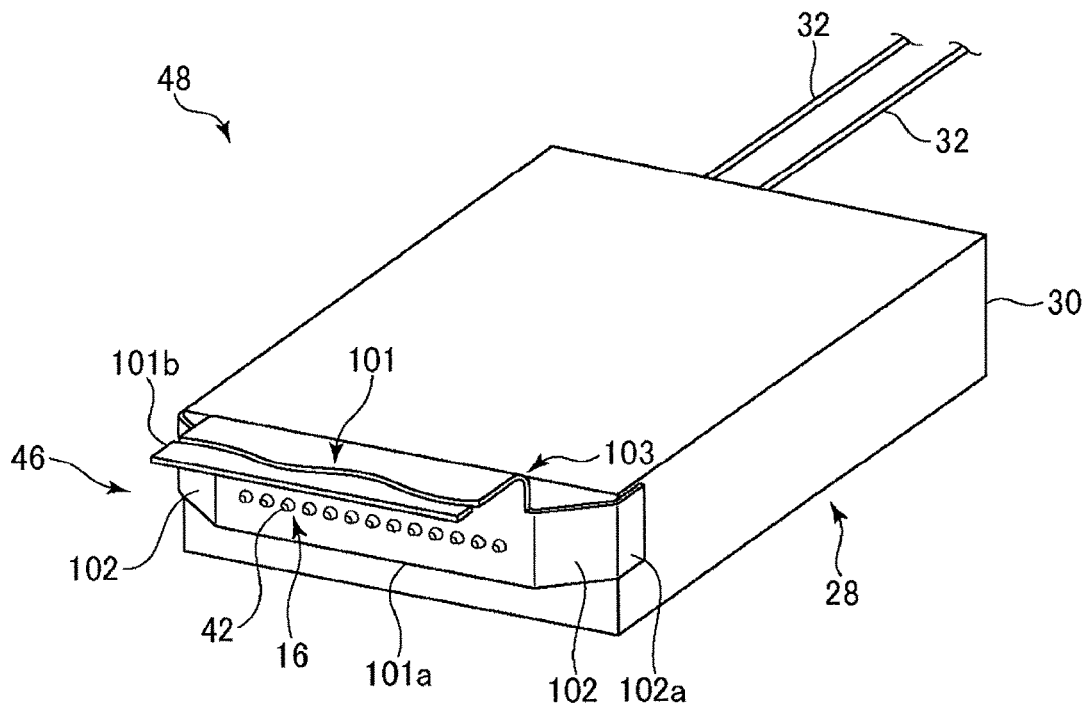
FIG. 6 is a perspective view illustrating a flexible substrate-attached component according to the second embodiment of the present invention.

A flexible substrate and a flexible substrate-attached component according to the second embodiment of the present invention will be described by using FIG. 5 and FIG. 6. FIG. 5 is a plan view illustrating the flexible substrate according to the present embodiment. FIG. 6 is a perspective view illustrating the flexible substrate-attached component according to the present embodiment. Note that the same components as those in the flexible substrate and the flexible substrate-attached component according to the above-described first embodiment are labeled with the same reference numerals, and the description thereof will be omitted or simplified.

The fundamental configuration of the flexible substrate according to the present embodiment is substantially the same as the configuration of the flexible substrate 10 according to the first embodiment. The flexible substrate according to the present embodiment is different from the flexible substrate 10 according to the first embodiment in that the protruding portions 102 are adapted to be fixed to the optical component 28 by adhesion or the like.

As illustrated in FIG. 5, in a flexible substrate 46 according to the present embodiment, a fixing portion 102a is provided to the end of each protruding portion 102. The fixing portion 102a can be bent from the base thereof along the second direction. In such a way, in the flexible substrate 46 of the present embodiment, each protruding portion 102 can be bent at a plurality of portions along the second direction. In FIG. 5, two bending lines of each protruding portion 102 are represented with dashed lines, respectively. Note that, while FIG. 5 illustrates the case where the fixing portion 102a is provided to each of the two protruding portions 102 protruding on both sides of the main portion 101, the fixing portion 102a may be provided to either one of both the protruding portions 102.

In the flexible substrate 46 according to the present embodiment, the protruding portions 102 are adapted to be bent from the base thereof toward the opposite side of the second portion 101b of the main portion 101. That is, when the flexible substrate 46 is adapted to be attached to the optical component 28, the protruding portions 102 are bent toward the optical component 28.

From each protruding portion 102 bent toward the optical component 28 side, each fixing portion 102a is adapted to be further bent from the base thereof toward the sidewall side of the optical component 28. The bent fixing portion 102a is adapted to be fixed to the sidewall of the casing 30 of the optical component 28 by adhesion using an adhesive agent or the like.

FIG. 6 illustrates a flexible substrate-attached component 48 according to the present embodiment on which the above-described flexible substrate 46 is mounted. As depicted, the flexible substrate 46 is attached to the optical component 28 via the plurality of first electrical connecting portions 16 in a similar manner to the flexible substrate 10 according to the first embodiment.

In the flexible substrate 46 attached to the optical component 28, in a similar manner to the first embodiment, the main portion 101 is bent along the first direction. The second portion 101b of the main portion 101 is bent toward the opposite side of the optical component 28.

On the other hand, the protruding portion 102 is bent along the second direction orthogonal to the first direction. In the present embodiment, unlike the first embodiment, the protruding portions 102 are bent toward the optical component 28 side.

The fixing portions 102a of the protruding portions 102 are bent toward the sidewalls side of the casing 30 of the optical component 28 along the second direction. Furthermore, the fixing portions 102a are fixed to the sidewalls of the casing 30 by adhesion using an adhesive agent or the like. Note that a fixing method of the fixing portions 102a to the sidewalls of the casing 30 is not limited to adhesion using an adhesive agent or the like and may be any method as long as being able to fix the fixing portions 102a to the sidewall of the casing 30.

In the flexible substrate-attached component 48 according to the present embodiment, the protruding portions 102 of the flexible substrate 46 are bent against bending or warping of the main portion 101, and the fixing portions 102a of the protruding portions 102 are fixed to the casing of the optical component 28. Fixing the protruding portions 102 in such a way can suppress the deformation of the flexible substrate 46 and further reduce stress occurring at the first electrical connecting portions 16 fixed to the optical component 28.

Further, the protruding portions 102 are fixed by the fixing portions 102a provided to the ends of the protruding portions 102. That is, such structure is employed that the adhesive agent or the like does not contact with the first electrical connecting portions 16, the second electrical connecting portions 18, and the wirings 20 of the flexible substrate 46 and further the lead pins 38 or the wirings 36 of the optical component 28. Therefore, in the case of the flexible substrate 46 in which the RF signal is transmitted, it is not necessary to take into consideration the impedance change in the wirings due to attachment of the adhesive agent. Thus, variation of the impedance can be reduced compared to a case where an adhesive agent is applied near the first electrical connecting portions 16, the second electrical connecting portions 18, and the wirings 20 for fixing.

Furthermore, in the flexible substrate-attached component 48 according to the present embodiment, the flexible substrate 46 is configured such that not only the protruding portions 102 are bent from the base thereof along the second direction but also the fixing portions 102a are bent from the base along the second direction. Therefore, the rigidity of the boundary portions between the protruding portions 102 and the first portion 101a is further enhanced against bending or warping of the main portion 101 along a direction intersecting the second direction, such as bending along the first direction of the main portion 101. In such a way, each protruding portion 102 is bent along the second direction at a plurality of portions, which can further reduce stress occurring at the first electrical connecting portions 16 due to bending or warping of the main portion 101.

Note that the flexible substrate-attached component 48 according to the present embodiment can be manufactured in a similar manner to the flexible substrate-attached component 26 according to the first embodiment except that the fixing portions 102a of the protruding portions 102 are fixed to the sidewalls of the casing 30 by adhesion using an adhesive agent or the like. The fixing portions 102a can be fixed to the sidewalls of the casing 30 after the flexible substrate 46 is attached to the optical component 28 via the plurality of first electrical connecting portions 16.

Third Embodiment

Figure 7:
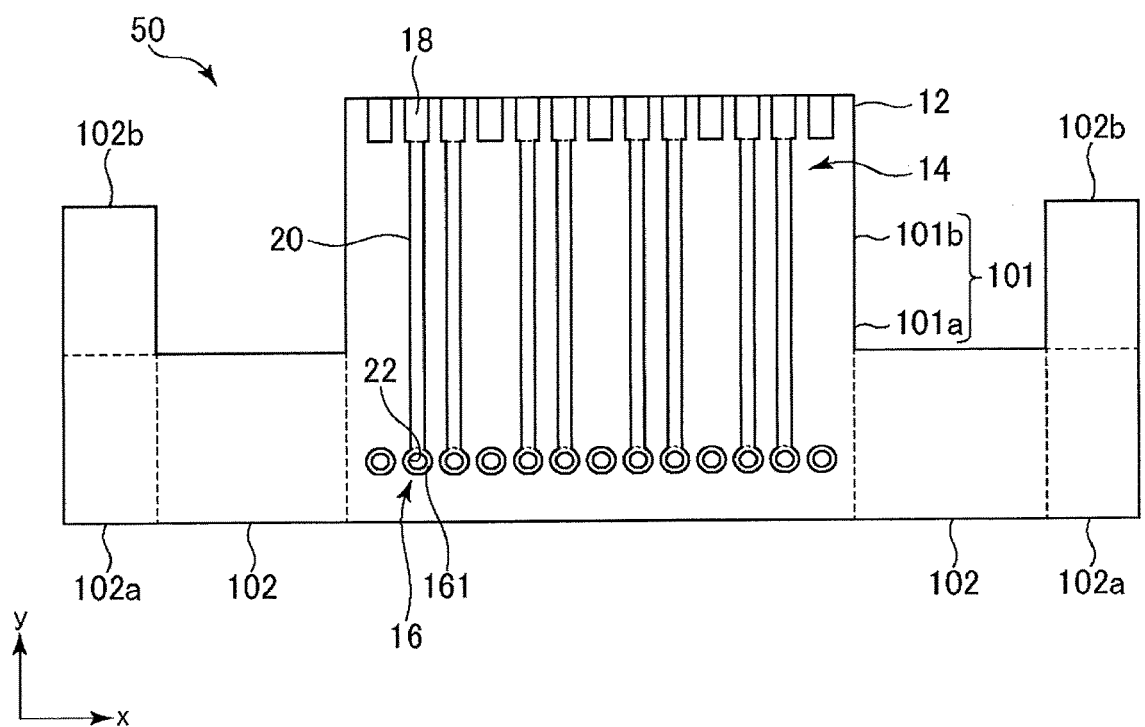
FIG. 7 is a plan view illustrating a flexible substrate according to a third embodiment of the present invention.
Figure 8:
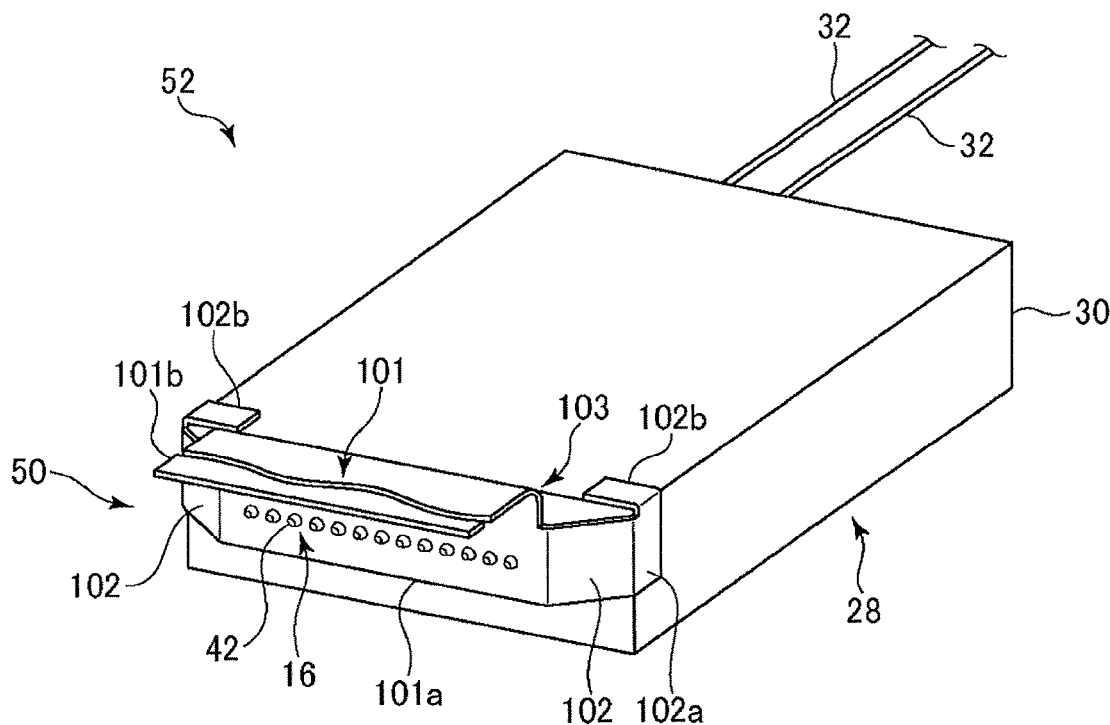
FIG. 8 is a perspective view illustrating a flexible substrate-attached component according to the third embodiment of the present invention.

A flexible substrate and a flexible substrate-attached component according to the third embodiment of the present invention will be described by using FIG. 7 and FIG. 8. FIG. 7 is a plan view illustrating the flexible substrate according to the present embodiment. FIG. 8 is a perspective view illustrating the flexible substrate-attached component according to the present embodiment. Note that the same components as those in the flexible substrate and the flexible substrate-attached component according to the above-described first and second embodiments are labeled with the same reference numerals, and the description thereof will be omitted or simplified.

The fundamental configuration of the flexible substrate according to the present embodiment is substantially the same as the configuration of the flexible substrate 46 according to the second embodiment. The flexible substrate according to the present embodiment is different from the flexible substrate 46 according to the second embodiment in that a plurality of portions of each protruding portion 102 are adapted to be fixed to different portions of the optical component 28.

As illustrated in FIG. 7, in the flexible substrate 50 according to the present embodiment, the fixing portions 102a are provided to the ends of the protruding portions 102 in a similar manner to the flexible substrate 46 according to the second embodiment. The fixing portions 102a can be bent from the base thereof along the second direction.

Furthermore, a fixing portion 102b protruding, from the side of the fixing portion 102a, in the same direction as the second portion 101b of the main portion 101 is provided to each protruding portion 102. The fixing portion 102b can be bent from the base along the first direction. In FIG. 7, three bending lines of each protruding portion 102 are depicted with dashed lines, respectively. Note that, while FIG. 7 illustrates the case where the fixing portions 102a and 102b are provided to each of the two protruding portions 102 protruding toward both sides of the main portion 101, the fixing portions 102a and 102b may be provided to either one of both the protruding portions 102.

In the flexible substrate 50 according to the present embodiment, in a similar manner to the case of the second embodiment, the protruding portions 102 are adapted to be bent from the base thereof toward the opposite side of the second portion 101b of the main portion 101. That is, when the flexible substrate 50 is adapted to be attached to the optical component 28, the protruding portions 102 are bent toward the optical component 28 side.

In a similar manner to the second embodiment, each fixing portion 102a is adapted to be further bent toward the sidewall side of the optical component 28 from the protruding portion 102 bent to the optical component 28 side. The bent fixing portion 102a is adapted to be fixed to the sidewall of the casing 30 of the optical component 28 by adhesion using an adhesive agent or the like.

Each fixing portion 102b is adapted to be further bent toward the top plate side of the optical component 28 from the fixing portion 102a bent toward the sidewall side of the optical component 28. The bent fixing portion 102b is adapted to be fixed to the top plate of the casing 30 of the optical component 28 by adhesion using an adhesive agent or the like.

FIG. 8 illustrates a flexible substrate-attached component 52 according to the present embodiment on which the above-described flexible substrate 50 is mounted. As depicted, the flexible substrate 50 is attached to the optical component 28 via the plurality of first electrical connecting portions 16 in the same manner as the flexible substrate 10 according to the first embodiment.

In the flexible substrate 50 attached to the optical component 28, the main portion 101 is bent along the first direction in the same manner as the first embodiment. The second portion 101b of the main portion 101 is bent toward the opposite side of the optical component 28.

On the other hand, the protruding portion 102 is bent along the second direction orthogonal to the first direction. In the present embodiment, the protruding portions 102 are bent toward the optical component 28 side in the same manner as the second embodiment.

The fixing portions 102a of the protruding portions 102 are bent toward the sidewall sides of the casing 30 of the optical component 28 along the second direction in the same manner as the second embodiment. Furthermore, the fixing portions 102a are fixed to the sidewalls of the casing 30 by adhesion using an adhesive agent or the like in the same manner as the second embodiment.

On the other hand, the fixing portions 102b are bent to the top plate side of the casing 30 of the optical component 28. Furthermore, the fixing portions 102b are fixed to the top plate of the casing 30 by adhesion using an adhesive agent or the like.

In the flexible substrate-attached component 52 according to the present embodiment, the protruding portions 102 of the flexible substrate 50 are bent against bending or warping of the main portion 101, and the fixing portions 102a and 102b of the protruding portions 102 are fixed to the casing 30 of the optical component 28. Fixing the protruding portions 102 in such a way can suppress the deformation of the flexible substrate 50 and further reduce stress occurring at the first electrical connecting portions 16 due to bending or warping of the main portion 101. In the present embodiment, since the fixing portions 102a and 102b, which are continuous multiple portions of the protruding portions 102, are fixed to the sidewalls and the top plate, which are different portions of the casing 30 of the optical component 28, stress can be reduced in a similar manner to the second embodiment.

Note that, while the case where the fixing portions 102b of the protruding portions 102 are fixed to the top plate of the casing 30 has been described above, otherwise, the fixing portions 102b may be configured to be fixed to the bottom plate of the casing 30, for example.

Further, the flexible substrate-attached component 52 according to the present embodiment can be manufactured in a similar manner to the flexible substrate-attached component 26 according to the first embodiment except that the fixing portions 102a and 102b of the protruding portions 102 are fixed to the sidewalls and the top plate of the casing 30 by adhesion using an adhesive agent or the like. The fixing portions 102a and 102b can be fixed to the sidewalls and the top plate of the casing 30 after the flexible substrate 50 is attached to the optical component 28 via the plurality of first electrical connecting portions 16.

Fourth Embodiment

Figure 9:
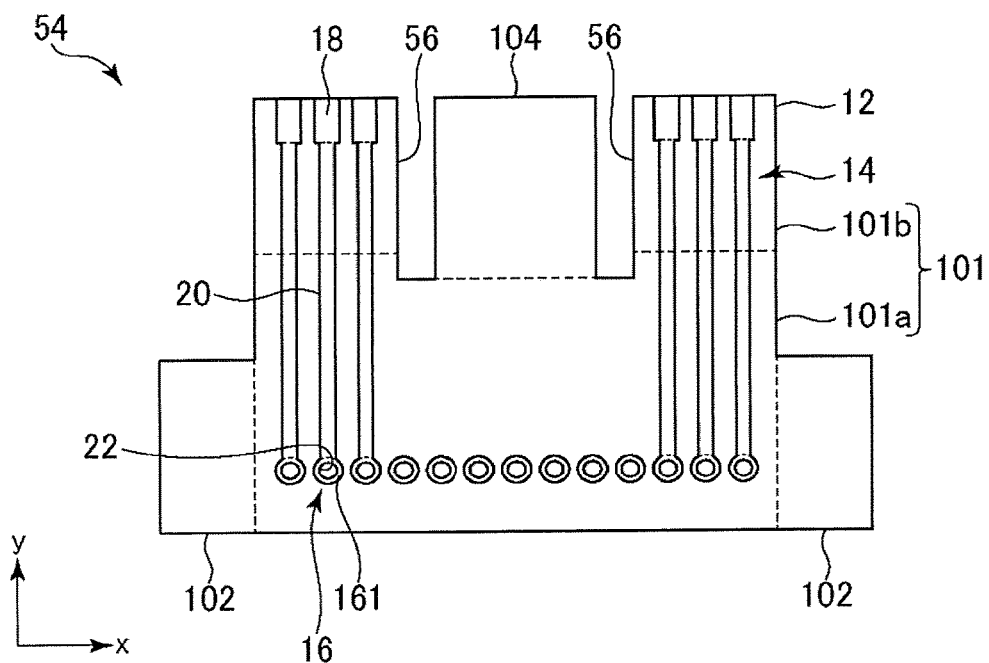
FIG. 9 is a plan view illustrating a flexible substrate according to a fourth embodiment of the present invention.
Figure 10:
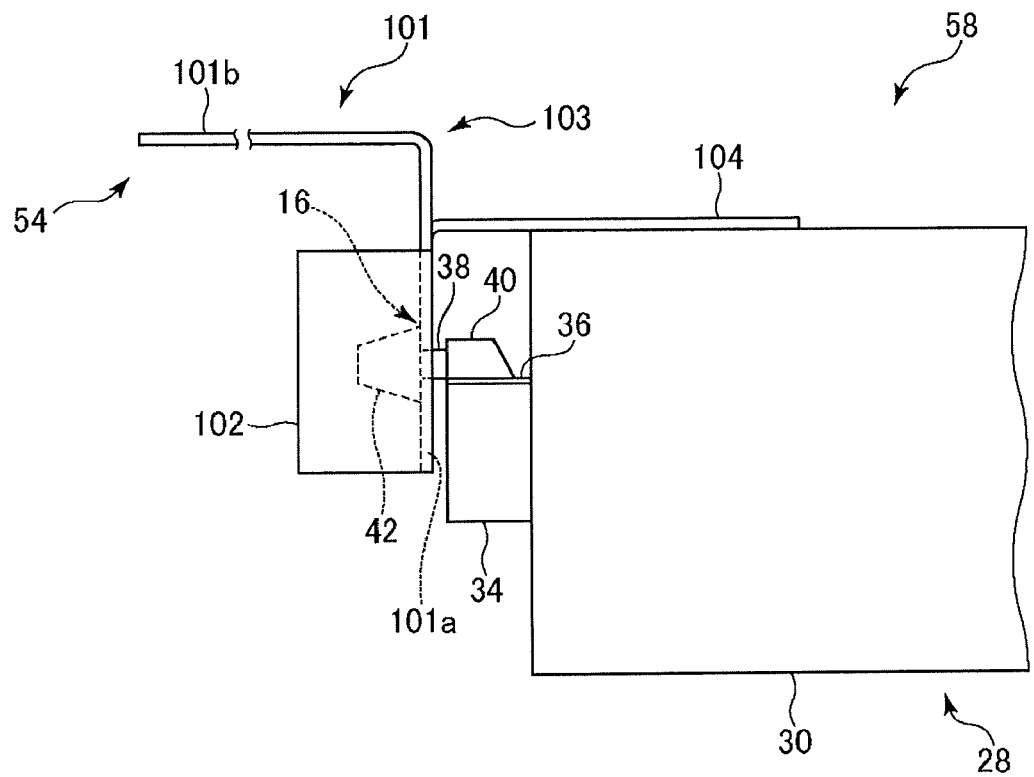
FIG. 10 is a side view illustrating a flexible substrate-attached component according to the fourth embodiment of the present invention.

A flexible substrate and a flexible substrate-attached component according to the fourth embodiment of the present invention will be described by using FIG. 9 and FIG. 10. FIG. 9 is a plan view illustrating the flexible substrate according to the present embodiment. FIG. 10 is a side view illustrating the flexible substrate-attached component according to the present embodiment. Note that the same components as those in the flexible substrate and the flexible substrate-attached component according to the above-described first to third embodiments are labeled with the same reference numerals, and the description thereof will be omitted or simplified.

The fundamental configuration of the flexible substrate according to the present embodiment is the same as the configuration of the flexible substrate 10 according to the first embodiment. The flexible substrate according to the present embodiment is different from the flexible substrate 10 according to the first embodiment in that a part of the main portion 101 is adapted to be fixed to the optical component 28.

As illustrated in FIG. 9, in the main portion 101 of a flexible substrate 54 according to the present embodiment, two notches 56 extending in the second direction are provided from a side running in the first direction on the second portion 101b side. Each notch 56 has substantially a rectangular planar shape, for example.

The center portion of the main portion 101 interposed between the notches 56 is a fixing portion 104 that can be bent from the base thereof along the first direction. The bent fixing portion 104 is adapted to be fixed by adhesion by using an adhesive agent or the like to the top plate of the casing 30 of the optical component 28.

FIG. 10 illustrates a flexible substrate-attached component 58 according to the present embodiment on which the above-described flexible substrate 54 is mounted. As depicted, the flexible substrate 54 is attached to the optical component 28 via the plurality of first electrical connecting portions 16 in a similar manner to the flexible substrate 10 according to the first embodiment.

In the flexible substrate 54 attached to the optical component 28, the second portion 101b of the main portion 101 except the fixing portion 104 is bent along the first direction toward the opposite side of the optical component 28.

On the other hand, the fixing portion 104 is bent along the first direction toward the optical component 28 side. Furthermore, the bent fixing portion 104 is fixed to the top plate of the casing 30 by adhesion using an adhesive agent or the like.

The protruding portion 102 is bent along the second direction intersecting the first direction toward the opposite side of the optical component 28 in a similar manner to the first embodiment. Note that the fixing portion(s) 102a may be provided to the protruding portion 102 in the same manner as the second embodiment, or fixing portions 102a and 102b may be provided in the same manner as the third embodiment.

In the flexible substrate-attached component 58 according to the present embodiment, the protruding portions 102 of the flexible substrate 54 are bent against bending or warping of the main portion 101, and the fixing portion 104 of the main portion 101 is fixed to the casing 30 of the optical component 28. Fixing the fixing portion 104 in such a way can suppress the deformation of the flexible substrate and further reduce stress occurring at the first electrical connecting portions 16 due to bending or warping of the main portion 101.

Note that, while the case where the single fixing portion 104 is provided to the main portion 101 of the flexible substrate 54 has been described above, a plurality of fixing portions to be fixed to the casing 30 of the optical component 28 in a similar manner to the fixing portion 104 may be provided to the main portion 101.

Further, the flexible substrate-attached component 58 according to the present embodiment can be manufactured in a similar manner to the flexible substrate-attached component 26 according to the first embodiment except that the fixing portion 104 of the main portion 101 is fixed to the top plate of the casing 30 by adhesion using an adhesive agent or the like. The fixing portion 104 can be fixed to the top plate of the casing 30 after the flexible substrate 54 is attached to the optical component 28 via the plurality of first electrical connecting portions 16.

Fifth Embodiment

Figure 11:
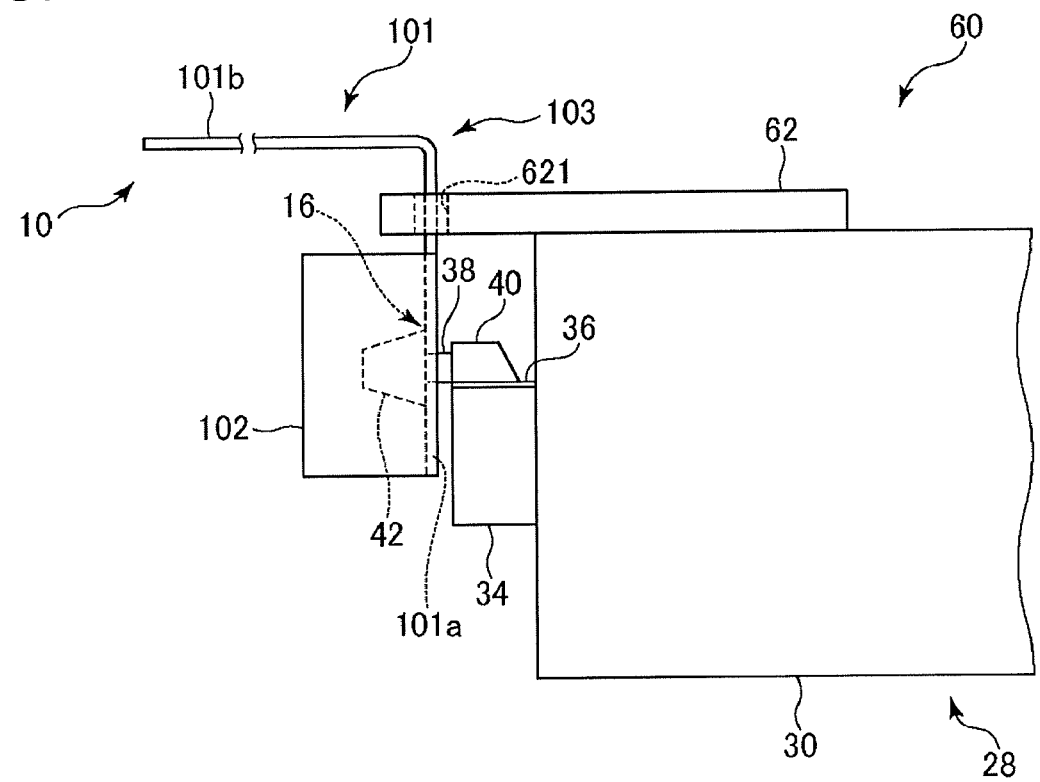
FIG. 11 is a side view illustrating a flexible substrate-attached component according to a fifth embodiment of the present invention.
Figure 12:
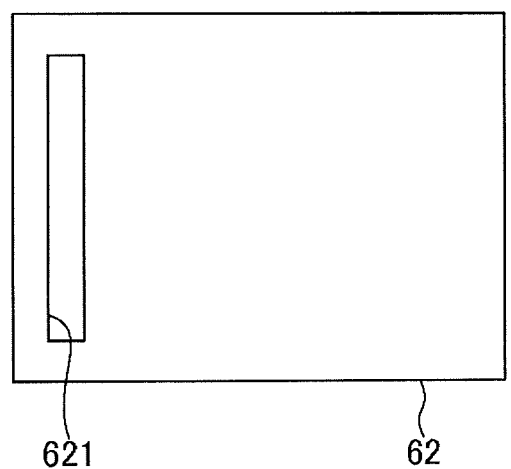
FIG. 12 is a plan view illustrating a restricting member in the flexible substrate-attached component according to the fifth embodiment of the present invention.
Figure 13:
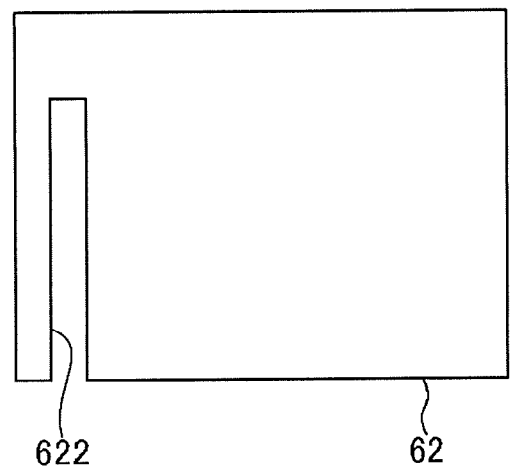
FIG. 13 is a plan view illustrating another example of a restricting member in the flexible substrate-attached component according to the fifth embodiment of the present invention.

A flexible substrate-attached component according to the fifth embodiment of the present invention will be described by using FIG. 11 to FIG. 13. FIG. 11 is a side view illustrating the flexible substrate-attached component according to the present embodiment. FIG. 12 is a plan view illustrating a restricting member in the flexible substrate-attached component according to the present embodiment. FIG. 13 is a plan view illustrating another example of a restricting member in the flexible substrate-attached component according to the present embodiment. Note that the same components as those in the flexible substrate and the flexible substrate-attached component according to the above-described first to fourth embodiments are labeled with the same reference numerals, and the description thereof will be omitted or simplified.

The fundamental configuration of the flexible substrate-attached component according to the present embodiment is substantially the same as the configuration of the flexible substrate-attached component 26 according to the first embodiment. The flexible substrate-attached component according to the present embodiment has a restricting member that restricts a movable range of the flexible substrate 10 attached to the optical component 28, which makes difference from the flexible substrate-attached component 26 according to the first embodiment.

As illustrated in FIG. 11, in a flexible substrate-attached component 60 according to the present embodiment, the flexible substrate 10 is attached to the optical component 28 via the plurality of first electrical connecting portions 16 in a similar manner to the first embodiment.

A restricting member 62 that restricts deformation of the flexible substrate 10 is fixed to the top plate of the casing 30 of the optical component 28. The restricting member 62 is fixed to the top plate of the casing 30 by adhesion using an adhesive agent or the like. The restricting member 62 is a plate-like portion, for example, and is fixed to the top plate of the casing 30 so as to partially protrude toward the attachment unit 34 side.

An opening 621 penetrating from one primary surface to the other primary surface is provided in a portion protruding toward the attachment unit 34 of the restricting member 62. The opening 621 has a thin planer shape whose longitudinal direction is in the first direction of the flexible substrate 10. More specifically, the opening 621 has substantially a rectangular planar shape, for example, as illustrated in FIG. 12. The width in the longitudinal direction of the opening 621 is substantially the same as or wider than the width of the main portion 101 of the flexible substrate 10. The width in the short direction of the opening 621 is substantially the same as or wider than the thickness of the main portion 101 of the flexible substrate 10.

The first portion 101a of the main portion 101 of the flexible substrate 10 is inserted through the opening 621. The flexible substrate 10 in which the first portion 101a of the main portion 101 is inserted through the opening 621 is bent along the first direction toward the opposite side of the optical component 28 above the restricting member 62 in a similar manner to the first embodiment.

The protruding portion 102 is bent along the second direction orthogonal to the first direction toward the opposite side of the optical component 28 in the same manner as the first embodiment. Note that the fixing portion(s) 102a may be provided to the protruding portion 102 in the same manner as the second embodiment, or fixing portions 102a and 102b may be provided in the same manner as the third embodiment.

As described above, in the flexible substrate-attached component 60 according to the present embodiment, the flexible substrate 10 attached to the optical component 28 is inserted through the opening 621 of the restricting member 62. Thus, the movable range of the flexible substrate 10 is restricted. This results in a smaller deformation such as bending or warping or the like of the flexible substrate 10. This can further reduce stress applied to the first electrical connecting portions 16 due to bending or warping of the main portion 101 of the flexible substrate 10.

The width in the short direction of the opening 621 through which the flexible substrate 10 is inserted can be set in accordance with the degree by which the movable range of the flexible substrate 10 is restricted. That is, a narrower width in the short direction of the opening 621 can restrict the movable range of the flexible substrate 10 to a smaller range.

For example, the width of the short direction of the opening 621 is set to substantially the same as or slightly wider than the thickness of the main portion 101 of the flexible substrate 10, and the opening 621 can be formed like a slit. The flexible substrate 10 is inserted through and held in the slit-like opening 621.

The restricting member 62 described above can be fixed to the casing 30 of the optical component 28 before the flexible substrate 10 is attached to the optical component 28. In this case, the main portion 101 of the bent flexible substrate 10 is inserted from the second portion 101b side through the opening 621 of the restricting member 62 fixed to the top plate of the casing 30 by adhesion using an adhesive agent or the like. Next, the flexible substrate 10 inserted through the opening 621 is attached to the optical component 28 via the plurality of first electrical connecting portions 16.

Further, the restricting member 62 can be fixed to the casing 30 of the optical component 28 after the flexible substrate 10 is attached to the optical component 28. In this case, the main portion 101 of the bent flexible substrate 10 after attached to the optical component 28 is inserted from the second portion 101b side through the opening 621. Next, the restricting member 62 in which the flexible substrate 10 is inserted through the opening 621 is fixed to the top plate of the casing 30 of the optical component 28 by adhesion using an adhesive agent or the like.

Note that, while the case where the flexible substrate is inserted through the opening 621 has been described above, the flexible substrate 10 inserted through the opening 621 may be further fixed to the inner wall of the opening 621. Adhesion using an adhesive agent or the like can be used to fix the flexible substrate 10 to the inner wall of the opening 621. Fixing the flexible substrate 10 to the inner wall of the opening 621 can further suppress deformation of the flexible substrate 10.

Further, while the case where the opening 621 is provided in the restricting member 62 has been described above, a notch 622 that is an opening whose one end is opened may be provided in the restricting member 62 as illustrated in FIG. 13 instead of the opening 621 whose entire circumference is surrounded by the material forming the restricting member 62. In this case, the notch 622 is provided to extend from one side of the restricting member 62 and have a thin planar shape whose longitudinal direction is in the first direction in the flexible substrate 10. More specifically, the notch 622 has substantially a rectangular planar shape, for example. The notch 622 also may have a slit-like shape in a similar manner to the opening 621.

Sixth Embodiment

Figure 14A:
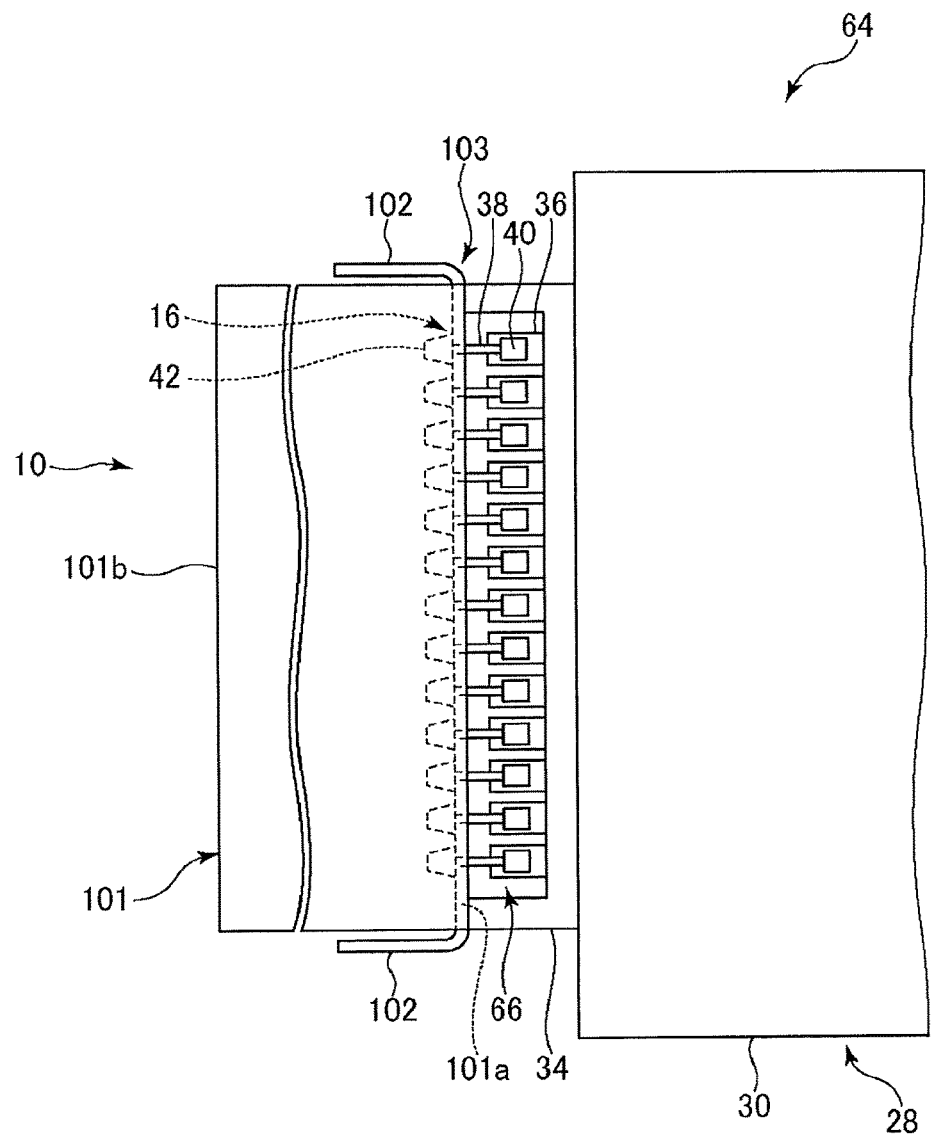
FIG. 14A is a schematic view (part 1) illustrating a flexible substrate-attached component according to a sixth embodiment of the present invention.
Figure 14B:
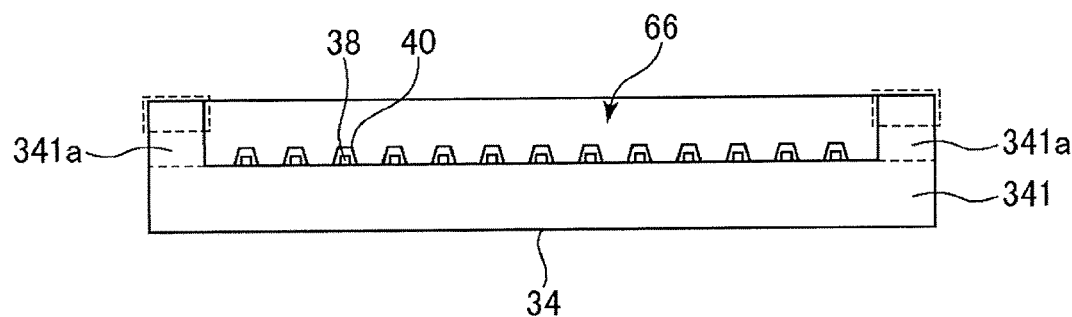
FIG. 14B is a schematic view (part 2) illustrating the flexible substrate-attached component according to the sixth embodiment of the present invention.

A flexible substrate-attached component according to the sixth embodiment of the present invention will be described by using FIG. 14A and FIG. 14B. FIG. 14A and FIG. 14B are schematic views illustrating the flexible substrate-attached component according to the present embodiment. Note that the same components as those in the flexible substrate and the flexible substrate-attached component according to the above-described first to fifth embodiments are labeled with the same reference numerals, and the description thereof will be omitted or simplified.

The fundamental configuration of the flexible substrate-attached component according to the present embodiment is substantially the same as the configuration of the flexible substrate-attached component 26 according to the first embodiment. The flexible substrate-attached component according to the present embodiment is different from the flexible substrate-attached component 26 according to the first embodiment in that the flexible substrate 10 is configured to be fixed also to the sidewall of the attachment unit 34.

FIG. 14A is a plan view illustrating a flexible substrate-attached component according to the present embodiment. FIG. 14B is a side view of the attachment unit of the optical component in the flexible substrate-attached component according to the present embodiment when viewed from the flexible substrate side.

As illustrated in FIG. 14A and FIG. 14B, in a flexible substrate-attached component 64 according to the present embodiment, a recess 66 is provided on the top surface of the attachment unit 34. The recess 66 is provided from an end of the attachment unit 34 on the flexible substrate 10 side toward the casing 30 of the optical component 28 side.

A side surface 341 of the end on the flexible substrate 10 side of the attachment unit 34 with the recess 66 has, on both sides of the recess 66, a step portion 341a higher than the bottom surface of the recess 66.

The plurality of wirings 36 are formed aligned on the bottom surface of the recess 66 in a similar manner to the first embodiment. The lead pins 38 are fixed by the fixing members 40 on each wiring 36 in the same manner as the first embodiment.

The lead pins 38 are inserted through the through holes in the first electrical connecting portions 16 correspondingly to the flexible substrate 10 in the same manner as the first embodiment. The lead pins 38 inserted through the through holes 22 are fixed and electrically connected to the land portions 161 of the first electrical connecting portions 16 by the fixing members 42. In the flexible substrate 10 attached to the attachment unit 34 in such a way, the first portion 101a of the main portion 101 contacts with the side surface 341 of the attachment unit 34.

Furthermore, the first portion 101a of the main portion 101 of the flexible substrate 10 is fixed to the side surface 341 by adhesion using an adhesive agent or the like on the upper end of the step portions 341a of the side surface 341. The upper end of the step portions 341a on which the first portion 101a of the main portion 101 is fixed is located higher than the lead pins 38 and the land portions 161 of the first electrical connecting portions 16 in which each lead pin 38 and each land portion 161 are fixed to each other. That is, the first portion 101a of the main portion 101 is fixed to the side surface 341 of the attachment unit 34 at the position closer to the bending portion 103, which is a portion where the main portion 101 is bent, than to the first electrical connecting portions 16 and the lead pins 38. Note that, in FIG. 14B, the upper ends of the step portions 341a to which the first portion 101a of the main portion 101 is fixed are surrounded by and depicted with dashed lines.

In the flexible substrate 10 attached to the optical component 28 in such a way, the main portion 101 and the protruding portion 102 are bent in the same manner as seen in the first embodiment. Note that the fixing portion(s) 102a may be provided to the protruding portion 102 in the same manner as seen in the second embodiment, or the fixing portions 102a and 102b may be provided to the protruding portion 102 in the same manner as seen in the third embodiment. Further, the fixing portion 104 may be provided to the main portion 101 in the same manner as seen in the fourth embodiment. Further, the restricting member 62 that restricts the movable range of the flexible substrate 10 may be provided on the casing 30 of the optical component 28 in the same manner as seen in the fifth embodiment.

As described above, in the flexible substrate-attached component 64 according to the present embodiment, the first portion 101a of the main portion 101 of the flexible substrate 10 is fixed to the side surface 341 of the attachment unit 34 at a location closer to the bending portion 103 of the main portion 101 than to the first electrical connecting portions 16. This can further reduce stress applied to the first electrical connecting portions 16 due to bending or warping of the main portion 101 of the flexible substrate 10.

Note that, while the flexible substrate 10 is fixed at the upper portions of the step portions 341a of the side surface 341 in the above description, the flexible substrate 10 may be fixed at another position of the side surface 341.

Further, the flexible substrate-attached component 64 according to the present embodiment can be manufactured in a similar manner to the flexible substrate-attached component 26 according to the first embodiment except that the first portion 101a of the main portion 101 is fixed to the side surface 341 of the attachment unit 34 by adhesion using an adhesive agent or the like. The first portion 101a can be fixed to the side surface 341 of the attachment unit 34 when the lead pins 38 are inserted through the through holes 22.

Seventh Embodiment

Figure 15:
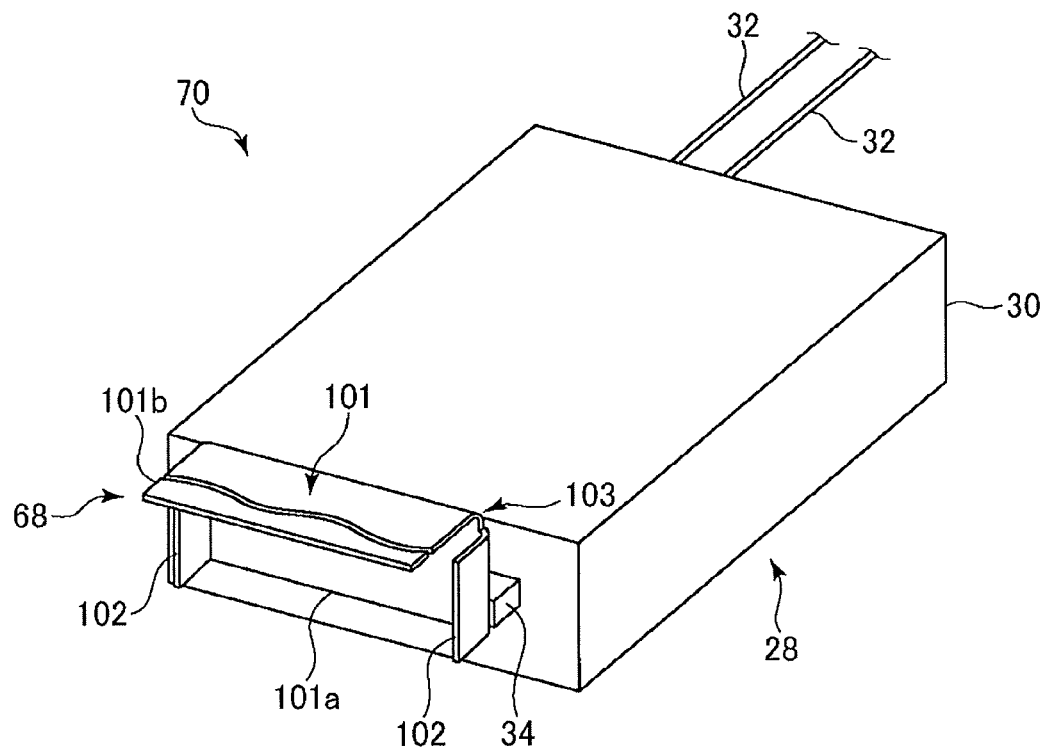
FIG. 15 is a perspective view illustrating a flexible substrate-attached component according to a seventh embodiment of the present invention.
Figure 16:
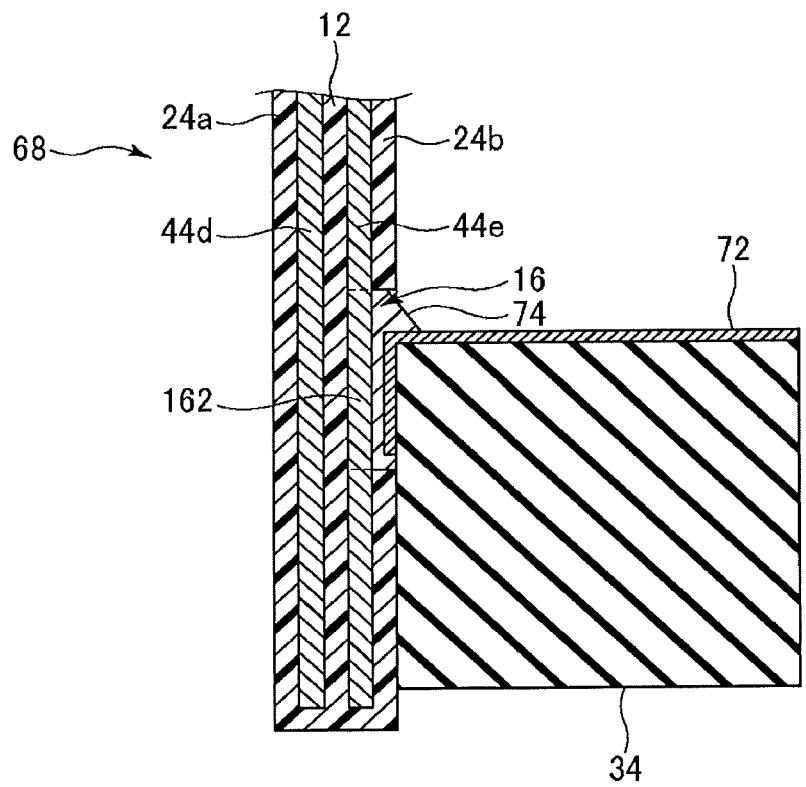
FIG. 16 is an enlarged sectional view illustrating an electrical connecting portion of the flexible substrate and the peripheral thereof in the flexible substrate-attached component according to the seventh embodiment of the present invention.

A flexible substrate-attached component according to the seventh embodiment of the present invention will be described by using FIG. 15 and FIG. 16. FIG. 15 is a perspective view illustrating the flexible substrate-attached component according to the present embodiment. FIG. 16 is an enlarged sectional view illustrating an electrical connecting portion of the flexible substrate and the peripheral thereof in the flexible substrate-attached component according to the seventh embodiment of the present invention. Note that the same components as those in the flexible substrate and the flexible substrate-attached component according to the above-described first to sixth embodiments are labeled with the same reference numerals, and the description thereof will be omitted or simplified.

In the above-described first to sixth embodiments, the case where the first electrical connecting portion 16 has the land portion 161 formed around the opening of the through hole 22 has been described. However, the structure of the first electrical connecting portion 16 is not limited to the structure requiring the through hole 22. A case where the first electrical connecting portion 16 is configured without using the through hole 22 will be described below in the present embodiment.

FIG. 15 illustrates a flexible substrate-attached component 70 in which a flexible substrate 68 is attached to the optical component 28 according to the present embodiment. In the flexible substrate 68 according to the present embodiment, each first electrical connecting portion 16 is configured without using the through hole 22 as illustrated in FIG. 16. The fundamental configuration of the flexible substrate 68 according to the present embodiment is substantially the same as the configuration of the flexible substrate 10 according to the first embodiment, except the first electrical connecting portions 16.

In the flexible substrate 68 according to the present embodiment, a conductive layer 44d forming a wiring pattern is formed on one primary surface of the sheet-like base member 12 and a conductive layer 44e forming a wiring pattern is formed on the other primary surface, as illustrated in FIG. 16. Coverlays 24a and 24b are formed on one primary surface and the other primary surface of the sheet-like base member 12 in which the conductive layers 44d and 44e are formed, respectively.

In the flexible substrate 68 according to the present embodiment, the first electrical connecting portion 16 is provided on the attachment unit 34 of the optical component side. The first electrical connecting portion 16 has a land portion 162 formed in the conductive layer 44e. The land portion 162 has substantially a circular planar shape, for example. The coverlay 24b is not formed on the land portion 162.

A plurality of wirings 72 are formed aligned correspondingly to the plurality of first electrical connecting portions 16 of the flexible substrate 68 on the upper surface and the side surface of the attachment unit 34 provided on the sidewall of the casing 30. Each wiring 72 is a metalized wiring made of a metal film of a high melting metal material, for example. Each wiring 72 is electrically connected to an electrode or the like of an optical semiconductor device inside the casing 30. Each wiring 72 is formed so as to extend from the top surface to the upper end of the sidewall of the attachment unit 34.

The end of each wring 72 on the flexible substrate 68 side is fixed and electrically connected to the land portion 162 of the corresponding first electrical connecting portion 16 by a conductive fixing member 74. For example, solder, a brazing filler metal, a conductive adhesive agent, or the like may be used for the fixing member 74.

As described above, the first electrical connecting portions 16 may be configured without using the through hole.

Modified Embodiments

The present invention is not limited to the above-described embodiments, and various modifications are possible.

Figure 17:
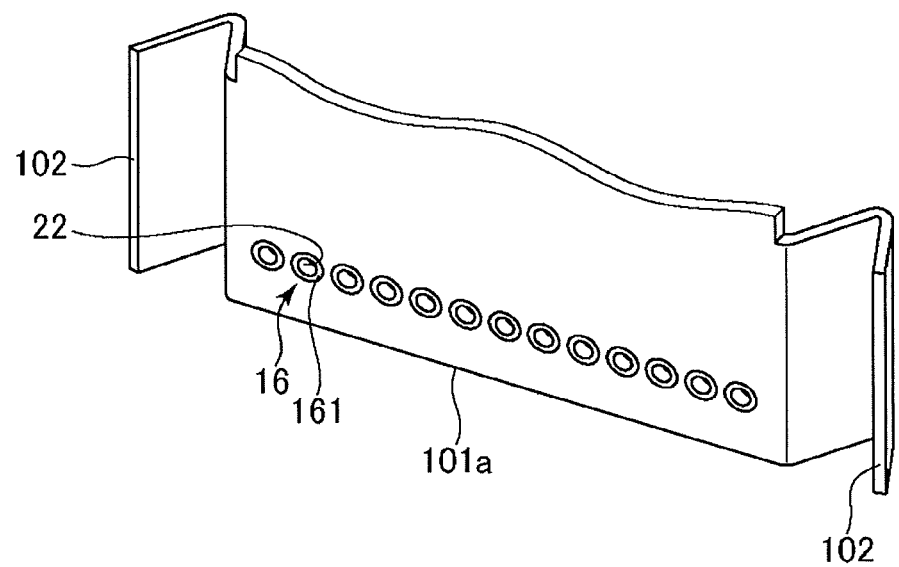
FIG. 17 is a perspective view (part 1) illustrating a flexible substrate according to a modified embodiment of the present invention.

For example, in the flexible substrate of the present invention, each protruding portion 102 may be adapted to be bent multiple times along a plurality of bending lines extending in substantially the same direction as each other, as illustrated in FIG. 17. Note that the protruding portion 102 may be bent to the opposite side in an alternating manner along a plurality of bending lines or may be bent continuously to the same side, or these bending forms may be combined.

Figure 18:
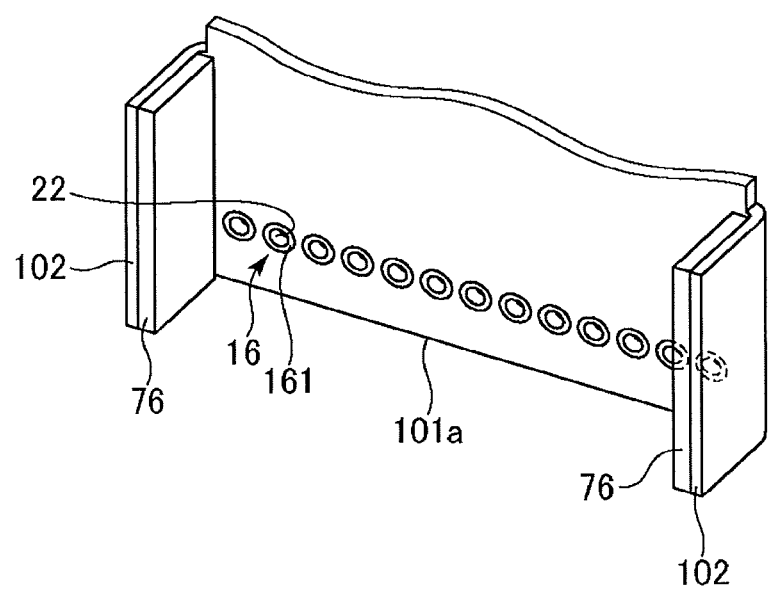
FIG. 18 is a perspective view (part 2) illustrating a flexible substrate according to a modified embodiment of the present invention.

Further, as illustrated in FIG. 18, a reinforcement member 76 such as a reinforcement plate may be provided on each protruding portion 102. The reinforcement member 76 can be provided on at least one of both sides of the protruding portion 102.

As described above, configuring the protruding portion 102 so as to be bent multiple times along a plurality of bending lines or providing the reinforcement member 76 on the protruding portion 102 can further ensure a reduction of concentration of stress.

Further, while the case where the flexible substrate is mounted on the optical component including an optical semiconductor device has been described in the above-described embodiments, the component on which the flexible substrate is mounted is not limited to optical components. The component on which the flexible substrate is mounted may be various components other than optical components.

Further, while the case where the main portion of the flexible substrate having substantially a rectangular planar shape is bent at a single position has been described in the embodiments described above, the planar shape of the main portion is not limited thereto, or the position of bending is not limited to a single position. The planar shape of the main portion can be any shape, and the main portion may be bent at a plurality of positions.

What is claimed is:

1. A flexible substrate having an insulating base member and a conductive layer that is formed on the base member and includes an electrical connecting portion fixed to a component and electrically connected to the component, the flexible substrate comprising:
   a main portion on which the electrical connecting portion is formed; and
   a protruding portion provided so as to protrude from a portion of the main portion in which the electrical connecting portion is formed, wherein
   a through hole penetrating from one primary surface to another primary surface of the flexible substrate is formed in the flexible substrate,
   the electrical connecting portion has a land portion formed around an opening of the through hole,
   the main portion can be bent or is bent along a first bending line extending in a first direction,
   the main portion includes a first portion with the through hole and a second portion without the through hole separated by the first bending line as a boundary,
   the protruding portion can be bent or is bent along second and third bending lines extending in a second direction intersecting the first direction, the protruding portion adapted to reduce stress occurring at the electrical connecting portion by the protruding portion being bent along the second and third bending lines, the second and third bending lines located on opposite sides of the main portion,
   the through hole is arranged within a width of the second portion, which is in the first direction, and
   the electrical connecting portion is located within a width of the second and third bending lines in the main portion.

2. The flexible substrate according to claim 1, wherein the electrical connecting portion is further located at a center of the second and third bending lines or on a side away from the first bending line with respect to the center of the second and third bending lines.

3. A flexible substrate-attached component comprising:
   a component; and
   a flexible substrate having an insulating base member and a conductive layer that is formed on the base member and includes an electrical connecting portion fixed to a component and electrically connected to the component, the flexible substrate comprising:
     a main portion on which the electrical connecting portion is formed, and
     a protruding portion provided so as to protrude from a portion of the main portion in which the electrical connecting portion is formed, wherein
     a through hole penetrating from one primary surface to another primary surface of the flexible substrate is formed in the flexible substrate,
     the electrical connecting portion has a land portion formed around an opening of the through hole,
     the main portion can be bent or is bent along a first bending line extending in a first direction,
     the main portion includes a first portion with the through hole and a second portion without the through hole separated by the first bending line as a boundary,
     the protruding portion is bent along second and third bending lines extending in a second direction intersecting the first direction, the protruding portion adapted to reduce stress occurring at the electrical connecting portion by the protruding portion being bent along the second and third bending lines, the second and third bending lines located at opposite sides of the main portion,
     the through hole is arranged within a width of the second portion, which is in the first direction,
     an electrical terminal of the component is inserted through the through hole and fixed and electrically connected to the land portion by a conductive fixing member, and
     the electrical connecting portion is located within a width of the second and third bending lines in the main portion.

4. The flexible substrate-attached component according to claim 3, wherein the protruding portion of the flexible substrate has a fixing portion fixed to the component.

5. The flexible substrate-attached component according to claim 4, wherein
   the protruding portion of the flexible substrate has a plurality of the fixing portions that are continuous, and
   the plurality of the fixing portions are fixed to different portions of the component.

6. The flexible substrate-attached component according to claim 3, wherein the main portion of the flexible substrate has a fixing portion bent toward the component side and fixed to the component.

7. The flexible substrate-attached component according to claim 3 further comprising a restricting member which is fixed to the component and in which an opening or a notch through which the flexible substrate is inserted is provided.

8. The flexible substrate-attached component according to claim 7, wherein the opening or the notch has a slit-like shape.

9. The flexible substrate-attached component according to claim 7, wherein the flexible substrate is fixed to an inner wall of the opening or the notch.

10. The flexible substrate-attached component according to claim 3, wherein the land portion is fixed to the component by a conductive fixing member and electrically connected to a wiring of the component.

11. The flexible substrate-attached component according to claim 3, wherein
    the component has an attachment unit having a surface with which the flexible substrate contacts, and
    the surface of the attachment unit has a portion which is closer to a bent portion of the main portion of the flexible substrate than to the electrical connecting portion and to which the main portion of the flexible substrate is fixed.

12. A manufacturing method of the flexible substrate-attached component according to claim 4, the manufacturing method comprising:
    preparing the flexible substrate having the insulating base member and the conductive layer that is formed on the base member and includes the electrical connecting portion fixed to the component and electrically connected to the component, the flexible substrate comprising the main portion on which the electrical connecting portion is formed, and the protruding portion provided so as to protrude from the portion of the main portion in which the electrical connecting portion is formed, wherein the through hole penetrating from the primary surface to the another primary surface of the flexible substrate is formed in the flexible substrate, the electrical connecting portion has the land portion formed around the opening of the through hole, the main portion can be bent or is bent along the first bending line extending in the first direction, the main portion includes the first portion with the through hole and the second portion without the through hole separated by the first bending line as a boundary, the protruding portion is bent along the second bending line and the third bending line extending in the second direction intersecting the first direction and is adapted to reduce stress occurring at the electrical connecting portion by the protruding portion being bent along the second and third bending lines, the second and third bending lines located at opposite sides of the main portion the through hole is arranged within a width of the second portion, which is in the first direction, the electrical terminal of the component is inserted through the through hole and fixed and electrically connected to the land portion by the conductive fixing member and;

fixing the electrical connecting portion of the flexible substrate to the component and attaching the flexible substrate to the component, wherein the electrical connecting portion is located within a width of the second and third bending lines in the main portion.

13. The manufacturing method of the flexible substrate-attached component according to claim 12, wherein, when the flexible substrate is attached to the component, the electrical connecting portion is fixed to the component by the conductive fixing member such that the electrical connecting portion is electrically connected to the component.

* * * * *